US010713136B2

(12) United States Patent
Ahmed et al.

(10) Patent No.: US 10,713,136 B2
(45) Date of Patent: Jul. 14, 2020

(54) MEMORY REPAIR ENABLEMENT

(71) Applicant: QUALCOMM Incorporated, San Diego, CA (US)

(72) Inventors: Fahad Ahmed, San Diego, CA (US); Chulmin Jung, San Diego, CA (US); Sei Seung Yoon, San Diego, CA (US); Esin Terzioglu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 190 days.

(21) Appl. No.: 15/713,557

(22) Filed: Sep. 22, 2017

(65) Prior Publication Data

US 2019/0095295 A1    Mar. 28, 2019

(51) Int. Cl.
*G11C 29/00* (2006.01)
*G06F 11/20* (2006.01)
*G11C 29/44* (2006.01)
*G11C 8/12* (2006.01)

(52) U.S. Cl.
CPC ...... *G06F 11/2094* (2013.01); *G11C 29/4401* (2013.01); *G11C 29/76* (2013.01); *G11C 29/789* (2013.01); *G11C 29/802* (2013.01); *G11C 29/842* (2013.01); *G06F 2201/805* (2013.01); *G06F 2201/82* (2013.01); *G06F 2201/85* (2013.01); *G11C 8/12* (2013.01); *G11C 2029/4402* (2013.01)

(58) Field of Classification Search
CPC ...... G06F 11/00; G06F 11/20; G06F 11/2094; G06F 2201/805; G06F 2201/82; G06F 2201/85; G11C 29/4401; G11C 29/76; G11C 29/789; G11C 29/802; G11C 29/842; G11C 8/12; G11C 2029/4402; G11C 29/00
See application file for complete search history.

(56) References Cited

U.S. PATENT DOCUMENTS

| 5,764,574 | A  | * | 6/1998 | Nevill .................. | G11C 29/785 365/200 |
| 6,154,851 | A  | * | 11/2000 | Sher ....................... | G11C 29/72 714/5.11 |
| 7,053,470 | B1 | * | 5/2006 | Sellers ................... | G11C 29/44 257/678 |
| 7,495,976 | B2 |   | 2/2009 | Mittal et al. | |

(Continued)

OTHER PUBLICATIONS

International Search Report and Written Opinion—PCT/US2018/048815—ISA/EPO—dated Nov. 20, 2018.

*Primary Examiner* — Albert Decady
*Assistant Examiner* — Enamul M Kabir
(74) *Attorney, Agent, or Firm* — Arent Fox, LLP

(57) ABSTRACT

In an example, a method of memory repair may include receiving, by a memory repair unit, a plurality of memory identifiers. The method may include determining, by the memory repair unit, that a first memory identifier of the plurality of memory identifiers corresponds to a first memory of a plurality of memories. The method may include determining, by the memory repair unit, that a second memory identifier corresponds to a second memory of the plurality of memories. The method may include outputting, by the memory repair unit, in parallel: a first value to a repair enable input of the first memory, and a second value to a repair enable input of the second memory.

27 Claims, 8 Drawing Sheets

(56) References Cited

U.S. PATENT DOCUMENTS

| | | | |
|---|---|---|---|
| 8,103,919 B1* | 1/2012 | Kumar | G11C 29/785 |
| | | | 714/711 |
| 8,462,570 B2 | 6/2013 | Blodgett | |
| 8,599,606 B2 | 12/2013 | Hsu | |
| 8,615,688 B2 | 12/2013 | Yoel et al. | |
| 9,251,917 B2 | 2/2016 | Noh | |
| 9,349,491 B1* | 5/2016 | Morgan | G11C 29/76 |
| 2003/0164510 A1* | 9/2003 | Dono | G11C 29/785 |
| | | | 257/200 |
| 2004/0034825 A1* | 2/2004 | Jeddeloh | G11C 29/44 |
| | | | 714/733 |
| 2006/0077734 A1* | 4/2006 | Fong | G11C 29/76 |
| | | | 365/200 |
| 2007/0183229 A1* | 8/2007 | Choi | G11C 5/04 |
| | | | 365/200 |
| 2009/0044045 A1 | 2/2009 | Kohara et al. | |
| 2009/0052270 A1* | 2/2009 | Kao | G11C 29/76 |
| | | | 365/230.06 |
| 2009/0158087 A1* | 6/2009 | Maeno | G11C 29/44 |
| | | | 714/6.12 |
| 2010/0226179 A1 | 9/2010 | Kim et al. | |
| 2012/0230136 A1* | 9/2012 | Gorman | G11C 29/4401 |
| | | | 365/200 |
| 2013/0173970 A1* | 7/2013 | Kleveland | G11C 29/808 |
| | | | 714/710 |
| 2014/0337573 A1 | 11/2014 | Chai et al. | |
| 2015/0262716 A1* | 9/2015 | Hendrickson | G11C 29/806 |
| | | | 365/185.09 |
| 2016/0078969 A1* | 3/2016 | Jung | G11C 11/418 |
| | | | 365/96 |
| 2016/0172058 A1 | 6/2016 | Srivastava et al. | |

* cited by examiner

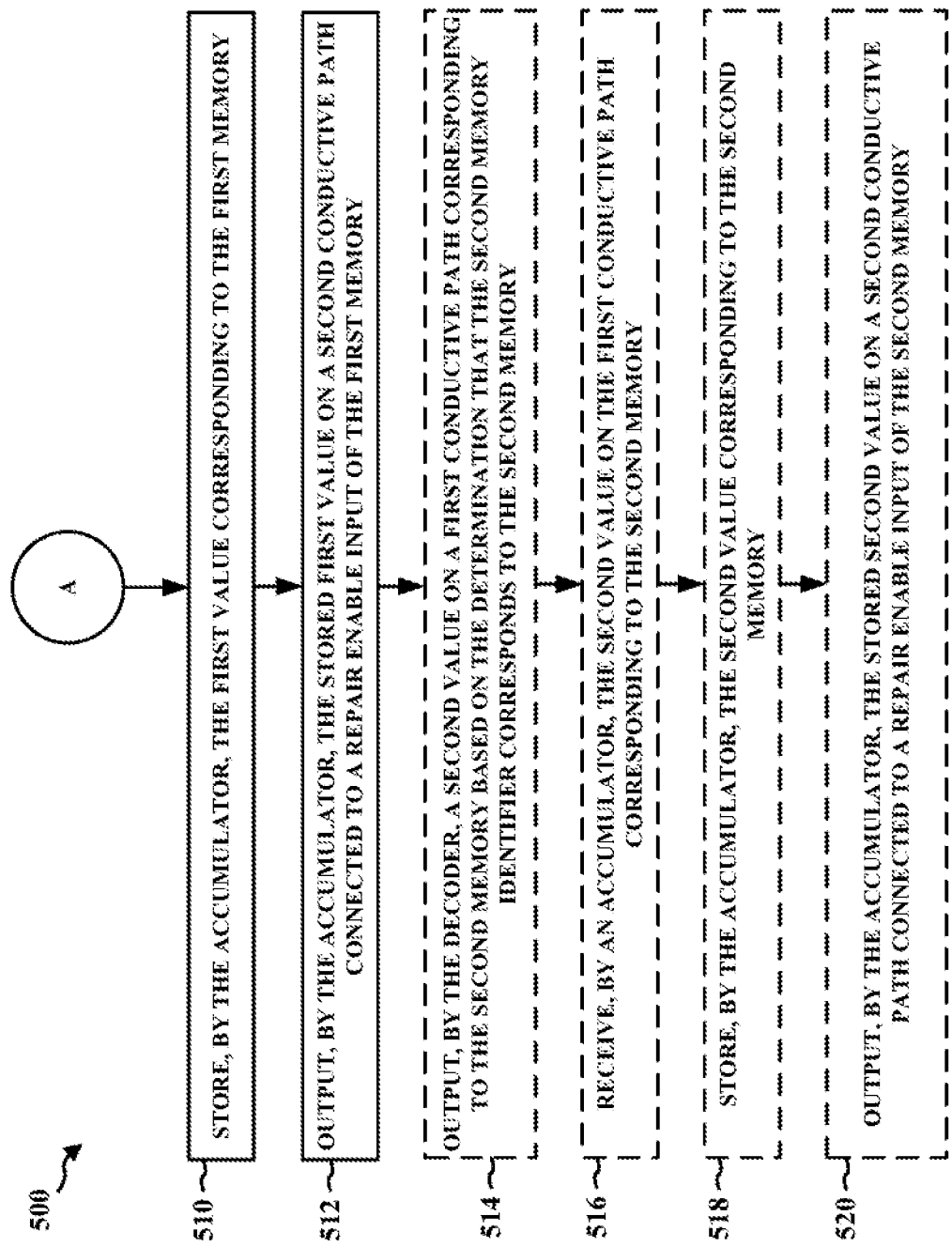

MEMORY REPAIR ENABLEMENT

BACKGROUND

Technical Field

The present disclosure relates generally to memory systems, and more particularly, to apparatuses configured for memory repair.

Introduction

Memory is widely used to store information. A memory may include a plurality of memory cells, often referred to as an array of memory cells, for storing data. A memory cell may store a value (e.g., a data bit), such as a binary value of "1" or a binary value of "0." As an example, the memory cell may store a first voltage corresponding to a first binary value or a second voltage corresponding to a second binary value. A memory cell may be defective in its original manufactured state or may become defective after one or more uses. A defective memory cell may be identified through testing. A memory may have one or more reserve memory cells that may be used to replace a defective a memory cell. Often times, a memory may include one or more reserve rows of memory cells and/or one or more reserve columns of memory cells. For example, a reserve row of memory cells may be used to replace a row of memory cells determined to have one or more defective memory cells. Similarly, a reserve column of memory cells may be used to replace a column of memory cells determined to have one or more defective memory cells.

Use of reserve memory cells to repair (e.g., replace) defective memory cells is commonplace. Notwithstanding, there exists a need for further improvements in memory repair technology.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may include a decoder and an accumulator. The decoder may be configured to receive a first memory identifier. The first memory identifier may correspond to a first memory. The decoder may be configured to determine that the first memory identifier corresponds to the first memory. The decoder may be configured to output a first value on a first conductive path corresponding to the first memory based on the determination that the first memory identifier corresponds to the first memory. The accumulator may be configured to receive the first value on the first conductive path corresponding to the first memory. The accumulator may be configured to store the first value corresponding to the first memory. The accumulator may be configured to output the first value on a second conductive path connected to a first repair enable input of the first memory.

In another aspect of the disclosure, a method, a computer-readable medium, and an apparatus are provided. The apparatus may be configured to receive a plurality of memory identifiers. The plurality of memory identifiers may include a first memory identifier and a second memory identifier. Each memory identifier of the plurality of memory identifiers may correspond to a respective memory of a plurality of memories. The first memory identifier may correspond to a first memory of the plurality of memories and the second memory identifier may correspond to a second memory of the plurality of memories. The apparatus may be configured to determine that the first memory identifier corresponds to the first memory. The apparatus may be configured to determine that the second memory identifier corresponds to the second memory. The apparatus may be configured to output a first value to a repair enable input of the first memory in parallel with a second value to a repair enable input of the second memory.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 5A and 5B illustrate an example flowchart of a method of memory repair in accordance with one or more techniques of this disclosure.

DETAILED DESCRIPTION

Figure 1:
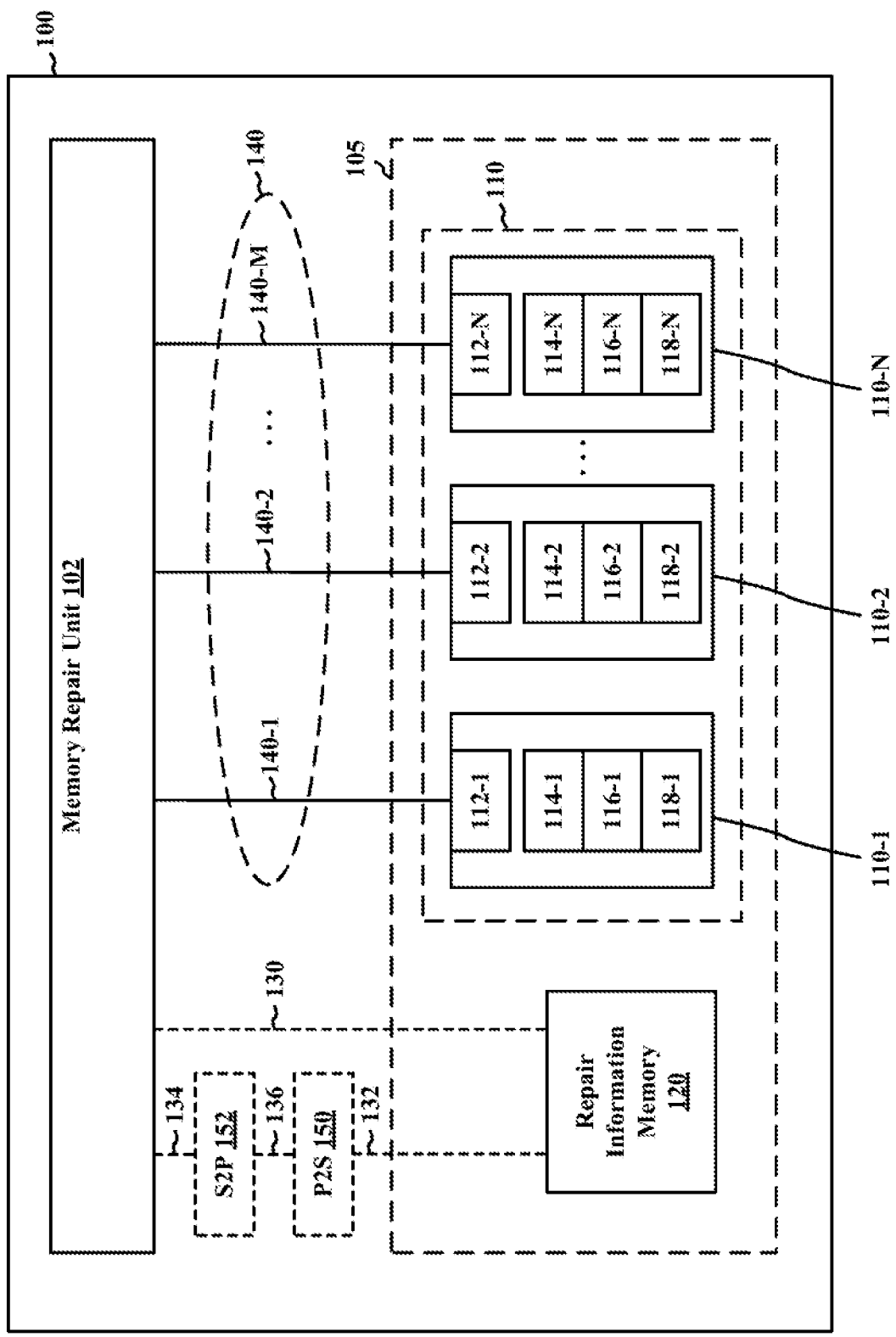
FIG. 1 is a diagram illustrating an example processing unit configured to perform one or more techniques of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of memory repair will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors (which may also be referred to as processing units) include microprocessors, microcontrollers, graphics processing units (GPUs), central processing units (CPUs), application processors, digital signal processors (DSPs), reduced instruction set computing (RISC) processors, systems on a chip (SOC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

As described herein, a memory may include one or more defective memory cells. The memory includes a repair enable input, which may be configured to inform the memory that the memory includes at least one defective memory cell. Otherwise described, a repair enable input of a memory may be configured to enable or disable memory repair on the memory. As the number of memories in a memory system (e.g., a processing unit or a system-on-chip) increase, so too does the number of repair enable inputs. The techniques described herein relate to reducing the hardware needed for enabling memory repair for enabling memory repair on a plurality of memories that include a defective memory cell. Otherwise described, the techniques described herein relate to more efficiently informing a plurality of memories that they include a defect somewhere.

As one example, instead of using N 1-way decoders for servicing N memories (where N is a positive integer), an M-way decoder is described herein for servicing M memories (where M is a positive integer). As the number of 1-way decoders increase (e.g., as the number of N memories increases), the gate area for implementing the 1-way decoders linearly increases because an additional 1-way decoder is needed for each memory. Conversely, in accordance with the techniques described herein, the gate area for implementing an M-way decoder does not linearly increase as the number M memories the M-way decoder may be configured to service increases. In some examples, the gate area for implementing an M-way decoder does not increase as the number M memories the M-way decoder may be configured to service increases. In some examples, a decoder of a memory repair unit described herein may be referred to as an M-way decoder.

FIG. 1 is a diagram illustrating an example processing unit 100 configured to perform one or more techniques of this disclosure. In some examples, the processing unit 100 may be referred to as an example memory system. The processing unit 100 may include a memory repair unit 102 and internal memory 105. Internal memory 105 may include a plurality of memories 110 and a repair information memory 120.

In some examples, the plurality of memories 110 may include one or more volatile and/or one or more non-volatile memories. For example, the plurality of memories 110 may include read-only memory (ROM), random access memory (RAM), static RAM (SRAM), dynamic RAM (DRAM), erasable programmable ROM (EPROM), electrically erasable programmable ROM (EEPROM), Flash memory, magnetic data media, optical storage media, any other storage media, or any combination thereof. In the example of FIG. 1, the plurality of memories 110 of internal memory 105 is depicted as a first memory 110-1, a second memory 110-2, and an Nth memory 110-N, where N is a positive integer. As an example, the first memory 110-1 may be a volatile memory and the second memory 110-2 may be a non-volatile memory. As another example, the first and second memories 110-1 and 110-2 may both be volatile memories or may both be non-volatile memories. Each memory of the plurality of memories 110-1 through 110-N may be separately addressable.

In some examples, each memory of the plurality of memories 110 of internal memory 105 may respectively correspond to one or more components of the processing unit 100. As used herein, reference to a memory corresponding to a component may refer to the memory being accessible by the component, the memory being communicatively coupled to the component, or the like. Similarly, reference to a memory not corresponding to a component may refer to the memory not being accessible by the component, the memory being communicatively coupled to the component, or the like.

For example, the processing unit 100 may include a plurality of processing cores. In such an example, the first memory 110-1 may correspond to a first processing core of the processing unit 100 and the second memory may correspond to a second processing core of the processing unit 100. Otherwise described, the first processing core of the processing unit 100 in this example may be configured to write data to and/or read data from the first memory 110-1 and the second processing core of the processing unit 100 in this example may be configured to write data to and/or read data from the second memory 110-2 In such an example, the second processing core of the processing unit 100 may not be able to write data to and/or read data from the first memory 110-1. Similarly, the first processing core of the processing unit 100 may not be able to write data to and/or read data from the second memory 110-2. In other examples, a first plurality of memories of internal memory 105 (e.g., memories 110-1, 110-2, 110-3, 110-4, and 110-5) may correspond to a first processing core and a second plurality of memories of internal memory 105 (e.g., memories 110-6, 110-7, 110-8, 110-9, and 110-10) may correspond to a second processing core. In such examples, memory 110-10 may be the Nth memory; however, in other examples, the internal memory 105 may include one or more memories of the plurality of memories 110 for one or more components different from the first processing core and the second processing core, meaning that memory 110-10 may not be the Nth memory of internal memory 105. As an example, the second processing core of the processing unit 100 may not be able to write data to and/or read data from the first plurality of memories of internal memory 105, and the first processing core of the processing unit 100 may not be able to write data to and/or read data from the second plurality of memories of internal memory 105.

The memory repair unit 102 may be configured to perform one or more techniques of memory repair described herein for the plurality of memories 110, which is described in more detail below with respect to FIGS. 3, 4A, 4B, 5A, 5B, and 6. The memory repair unit 102 may be communicatively coupled to internal memory 105. For example, the memory repair unit 102 may be communicatively coupled to the plurality of memories 110 and the repair information memory 120. In some examples, the memory repair unit 102 may be configured to receive information from the repair information memory 120. In some examples, the memory repair unit 102 may be configured to receive information from the repair information memory 120 upon the occurrence of a trigger event. For example, the repair information memory 120 may be configured to send information stored thereon to the memory repair unit 102 in response to a trigger event. In some examples, the trigger event may include power-up of the processing unit 100. The memory repair unit 102 may be configured to process information received from the repair information memory 120. Based on the processing of the information received from the repair information memory 120, the memory repair unit 102 may be configured to output information to at least one memory of the plurality of memories 110 to enable memory repair on the at least one memory. In some examples, the terms "data" and "information" may be interchangeable.

In some examples, the term "communicatively coupled" may refer to a communication connection, which may be direct or indirect. A communication connection may be wired and/or wireless. A wired connection may refer to a conductive path, a trace, or a physical medium (excluding wireless physical mediums) over which information may travel. A conductive path may refer to any conductor of any length, such as a conductive pad, a conductive via, a conductive plane, a conductive trace, or any conductive medium. A direct communication connection may refer to a connection in which no intermediary component resides between the two communicatively coupled components. An indirect communication connection may refer to a connection in which at least one intermediary component resides between the two communicatively coupled components.

In the example of FIG. 1, the memory repair unit 102 is communicatively coupled to the plurality of memories 110 via a plurality of communication connections 140. For example, the processing unit 100 may be described as including a plurality of communication connections 140 for communicatively coupling the memory repair unit 102 and the plurality of memories 110. In some examples, the memory repair unit 102 may be communicatively coupled to the repair information memory 120 via communication connection 130. For example, the processing unit 100 may be described as including communication connection 130 for communicatively coupling the memory repair unit 102 and the repair information memory 120. The communication connection 130 illustrates an example of a direct connection between the memory repair unit 102 and the repair information memory 120. In this example, a parallel-to-serial (P2S) converter and a serial-to-parallel converter (S2P) converter may not be present or otherwise positioned between the memory repair unit 102 and the repair information memory 120. In some examples, the communication connection 130 may represent a single conductive path, such as a single wire or a single trace. In other examples, the communication connection 130 may represent a plurality of conductive paths (e.g., 10, 100, 500, 800, 1000, or more conductive paths).

In other examples, the memory repair unit 102 may be communicatively coupled to a serial-to-parallel (S2P) converter 152 via communication connection 134 and the repair information memory 120 may be communicatively coupled to a parallel-to-serial (P2S) converter 150 via communication connection 132. For example, the processing unit 100 may be described as including the S2P converter 152 and the P2S converter 150 and communication connections 132, 134, and 136. The S2P converter 152 and the P2S converter 150 may be communicatively coupled via communication connection 136. The communication connection 136 illustrates an example of a direct connection between the S2P converter 152 and the P2S converter 150. Because the S2P converter 152 and the P2S converter 150 are positioned between the memory repair unit 102 and the repair information memory 120 in this example, the memory repair unit 102 and the repair information memory 120 may be described as being indirectly communicatively coupled to each other. In some examples, the communication connections 132 and 134 may represent a number of conductive paths R, where R is a positive integer greater than 1. For example, R may be equal to 10, 100, 500, 800, or 1000. The communication connection 136 may represent a number of conductive paths S, where S is a positive integer less than R. For example, provided that S is less than R, S may be equal to 1, 2, 3, 4, 5, 6, 7, 8, 9, 10, or more. As an example, where S is equal to 1, that would mean that the communication connection 136 represents a single conductive path.

The P2S converter 150 may be configured to serialize parallel data (e.g., convert parallel data into serial data). The P2S converter 150 may include two or more inputs and one or more outputs. As an example, the P2S converter 150 may be configured to receive data on two inputs, serialize the data received on the two inputs, and output the serialized data using a single output. As another example, the P2S converter 150 may be configured to receive data on four inputs, serialize the data received on the four inputs, and output the serialized data using a single output. As another example, the P2S converter 150 may be configured to receive data on four inputs, serialize the data received on a first input and a second input of the four inputs, serialize the data received on a third input and a fourth input of the four inputs, output the serialized data corresponding to the first and second inputs using a first output, and output the serialized data corresponding to the third and fourth inputs using a second output. As another example, the P2S converter 150 may be configured to receive data on X inputs, serialize the data received on the X inputs, and output the serialized data using Y outputs, where X and Y are positive integers and Y is less than X. In this regard, the communication connection 136 may represent the Y outputs of the P2S converter 150 being communicatively coupled to inputs of the S2P converter 152.

The S2P converter 152 may be configured to perform the inverse function of the P2S converter 150. For example, the S2P converter 152 may be configured to deserialize serial data (e.g., convert serial data into parallel data). The S2P converter 152 may include one or more inputs and two or more outputs. As an example, the S2P converter 152 may be configured to receive serialized data from the P2S converter 150 on one input, deserialize the serialized data received on the input, and output the deserialized data using a two outputs. As another example, the S2P converter 152 may be configured to receive serialized data from the P2S converter 150 on one input, deserialize the serialized data received on the input, and output the deserialized data using four outputs. As another example, the S2P converter 152 may be configured to receive serialized data from the P2S converter 150 on two inputs, deserialize the serialized data received on a first input of the two inputs, deserialize the serialized data received on a second input of the two inputs, output the deserialized data corresponding to the first input using two or more outputs, and output the deserialized data corresponding to the second input using two or more outputs different from the two or more outputs used to output the deserialized data corresponding to the first input. As another example, the S2P converter 152 may be configured to receive data on X' inputs, deserialize the serialized data received on the X' inputs, and output the deserialized data using Y' outputs, where X' and Y' are positive integers and X' is less than Y'. In some examples, X may equal Y' and Y may equal X'. For example, the communication connection 136 may represent the Y outputs of the P2S converter 150 being communicatively coupled to the X' inputs of the S2P converter 152. Otherwise described, the number of inputs of the P2S converter 150 used to receive data from the repair information memory 120 may be equal to the number of outputs of the S2P converter 152 used to send deserialized data to the memory repair unit 102. Similarly, the number of outputs of the P2S converter 150 used to send serialized data to the S2P converter 152 may be equal to the number of inputs of the S2P converter 152 used to receive serialized data from the P2S converter 150.

While two examples of communication coupling between the memory repair unit 102 and the repair information memory 120 are shown in FIG. 1; in some aspects, one communication coupling may be implemented. Additionally, while two examples of communication coupling between the memory repair unit 102 and the repair information memory 120 are shown in FIG. 1, more or fewer communication coupling between the memory repair unit 102 and the repair information memory 120 may also exist but are not depicted.

Regarding the plurality of communication connections 140, each memory of the plurality of memories 110 may be separately communicatively coupled to the memory repair unit 102. As illustrated in the example of FIG. 1, the memory repair unit 102 may be communicatively coupled to the first memory 110-1 via communication connection 140-1, the memory repair unit 102 may be communicatively coupled to the second memory 110-2 via communication connection 140-2, and the memory repair unit 102 may be communicatively coupled to the Nth memory 110-N via communication connection 140-M, where M is equal to N. In some examples, each respective communication connection 140-1 through 140-M may represent a single conductive path, such as a single wire or a single trace.

As used herein, a memory may refer to any memory (e.g., an integrated circuit memory, a memory chip, a memory microchip, or the like) that includes a repair enable input, one or more inputs and/or outputs, a plurality of memory cells, and one or more reserve memory cells. For example, the first memory 110-1 may include a repair enable input 112-1, one or more inputs and/or outputs 114-1, a plurality of memory cells 116-1, and one or more reserve memory cells 118-1; the second memory 110-2 may include a repair enable input 112-2, one or more inputs and/or outputs 114-2, a plurality of memory cells 116-2, and one or more reserve memory cells 118-2; and the Nth memory 110-N may include a repair enable input 112-N, one or more inputs and/or outputs 114-N, a plurality of memory cells 116-N, and one or more reserve memory cells 118-N.

In some examples, an input of a memory may correspond to a conductive pin, pad, or the like of the memory. For example, the repair enable input may correspond to a conductive pin, pad, or the like of the memory. Similarly, an output of a memory may correspond to a conductive pin, pad, or the like of the memory. In some examples, the one or more inputs of a memory may include a plurality of memory address inputs, which may be used for specifying a memory location (e.g., specify one or more memory cells) and/or for memory address decoding. The one or more outputs of a memory may include one or more data outputs. For example, a read instruction received by a memory may cause the memory to output the data stored in one or more memory cells on the one or more data outputs.

The plurality of memory cells of a memory may be configured to store data/information. A memory cell may store a value (e.g., a data bit representative of a logic value), such as a binary value of "1" or a binary value of "0." As an example, a memory cell may store a first voltage corresponding to a first binary value or a second voltage corresponding to a second binary value. For example, a value of "0" may correspond to a voltage of 0 and a value of "1" may correspond to a voltage of 1. As another example, a value of "0" may correspond to a voltage of −1 and a value of "1" may correspond to a voltage of 1. As another example, a value of "0" may correspond to a voltage less than or equal to a threshold value (e.g., 0 volts) and a value of "1" may correspond to a voltage greater than the threshold value. In some examples, data may be written to and/or read from the plurality of memory cells, depending on the type of memory (e.g., whether the memory is ROM, RAM, or another type of memory). The plurality of memory cells may be referred to as an array of memory cells when arranged as such. For example, a memory may include rows and columns of memory cells.

In a memory described herein, a memory cell may be defective. For example, a memory cell may be defective in its original manufactured state or may become defective after one or more uses. A defective memory cell may be identified through testing. In some examples, a defective memory cell may refer to a memory cell that does not operate properly. For example, a defective memory cell may refer to a memory cell that is unable to store a value. As another example, a defective memory cell may refer to a memory cell that cannot be written to and/or read from. As another example, a defective memory cell may refer to a memory cell that cannot store a non-zero voltage. As another example, a defective memory cell may refer to a memory cell that cannot store a zero voltage. As another example, a defective memory cell may refer to a memory cell that cannot store a value, such as a binary value of "1" or a binary value of "0." In some examples, a row of memory cells or a column of memory cells in which a defective memory cell resides may be considered defective. In some examples, a defective memory cell may have an address, and the row and/or column in which the defective memory cell resides may have an address.

In some examples, the repair information memory 120 may be configured to store defective memory address information corresponding to one or more memories of the plurality of memories 110. The defective memory address information may include a memory address corresponding to a defective memory cell in a memory, a memory address (e.g., row address) corresponding to a row of memory cells in which a defective memory cell resides in a memory, and/or a memory address (e.g., column address) corresponding to a column of memory cells in which a defective memory cell resides in a memory. As an example, if the first memory 110-1 includes a defective memory cell, then the repair information memory 120 may be configured to store memory address information corresponding to the defective memory cell in the first memory 110-1. To reduce the consumption of the repair information memory 120, information stored therein may be encoded. For example, defective memory address information may be encoded or otherwise compressed prior to storage in the repair information memory 120.

In some examples, the repair information memory 120 may be configured to store a respective memory identifier for one or more memories of the plurality of memories 110. A memory identifier may uniquely identify a memory to which the memory identifier corresponds. As an example, each memory of the plurality of memories 110 that includes at least one defective memory cell may be associated with a respective memory identifier stored in the repair information memory 120. In such an example, if a particular memory does not include a defective memory cell, then the repair information memory 120 may not be configured to store a memory identifier corresponding to the particular memory. In such an example, a memory identifier may indicate that the memory corresponding thereto includes at least one defective memory cell. For example, the plurality of memories 110 may include four memories 110-1, 110-2, 110-3, and 110-4. However, the first memory 110-1 and the second memory 110-2 may be the only memories among the plurality of memories that include at least one defective memory cell. Therefore, a first memory identifier corresponding to the first memory 110-1 may be stored in the repair information memory 120 and a second memory identifier corresponding to the second memory 110-2 may be stored in the repair information memory 120, but a memory identifier may not be stored in the repair information memory 120 for the third and fourth memories 110-3 and 110-4.

As another example, each memory of the plurality of memories 110 may be associated with a respective memory identifier regardless of whether the memory includes a defective memory cell. For example, if the plurality of memories 110 includes four memories, a first memory identifier may correspond to the first memory 110-1, a second memory identifier may correspond to the second memory 110-2, a third memory identifier may correspond to the third memory 110-3, and a fourth memory identifier may correspond to the fourth memory 110-4. The repair information memory 120 may be configured to store a data structure that includes each memory identifier that corresponds to a memory that includes at least one defective memory cell. In this example, if only the third memory 110-3 among the four memories includes at least one defective memory cell, then the data structure may only include the third memory identifier. In such an example, a memory identifier included in the data structure may indicate that the memory corresponding the memory identifier includes at least one defective memory cell. In some examples, the data structure may be referred to as a memory defect data structure that includes information that identifies one or more memories among the plurality of memories 110 that include at least one defective memory cell. The information may, for example, include a memory identifier. In some examples, the data structure may constitute a look-up table (LUT), where an input of a memory identifier results in the output corresponding to the input.

In some examples, the number of bits used to represent a memory identifier may be derived using an algorithm, such as a log base 2 algorithm. The log base 2 algorithm may be defined as $\log_2(x)=z$, where z is the result $\log_2(x)$ and x may be equal to the total number of memories of the plurality of memories 110. In other examples, x may be equal to the number of memories that include at least one defective memory cell. In some examples, the result of z may be rounded up to the nearest integer. For example, if the plurality of memories 110 includes 1012 memories, then $\log_2(1012)=9.983$, the result of which may be rounded to 10. The value of 10 may represent the number of bits used to identify each memory of the plurality of memories 110. As another example, if the plurality of memories 110 includes 52 memories, then $\log_2(52)=5.7$, the result of which may be rounded to 6. The value of 6 may represent the number of bits used to identify each memory of the plurality of memories 110. As one example, the plurality of memories 110 may include memories 110-1, 110-2, 110-3, and 110-4. $\log_2(4)=2$, meaning that 2 bits may be used as a memory identifier for each of the memories. In this example, a first memory identifier corresponding to the first memory 110-1 may be the binary number 00, a second memory identifier corresponding to the second memory 110-2 may be the binary number 01, a third memory identifier corresponding to the third memory 110-3 may be the binary number 10, and a fourth memory identifier corresponding to the fourth memory 110-4 may be the binary number 11. Similarly, if the number of memories that include at least one defective memory cell is 60, $\log_2(60)=5.907$, the result of which may be rounded to 6. The value of 6 may represent the number of bits used to identify each memory of the plurality of memories 110 that includes at least one defective memory cell.

A reserve memory cell may be used to replace a defective a memory cell. For example, the one or more reserve memory cells of a memory may include one or more reserve rows of memory cells and/or one or more reserve columns of memory cells. For example, a reserve row of memory cells may be used to replace a row of memory cells determined to have one or more defective memory cells. Similarly, a reserve column of memory cells may be used to replace a column of memory cells determined to have one or more defective memory cells. Other terms for "reserve" may include "extra," "redundant," "spare," or the like. For example, reference to a reserve memory cell may similarly refer to an extra, redundant, or spare memory cell of the memory.

Referring to a repair enable input of a memory, the repair enable input may be configured to inform the memory that the memory includes at least one defective memory cell. For example, the memory repair unit 102 may be configured to send information to a repair enable input of a memory to inform the memory that the memory includes at least one defective memory cell. Otherwise described, the repair enable input may be configured to enable memory repair on the memory because the memory includes at least one defective memory cell. For example, the memory repair unit 102 may be configured to send information to a repair enable input of a memory to enable memory repair on the memory because the memory includes at least one defective memory cell.

In some examples, the information sent by the memory repair unit 102 to a repair enable input of a memory may be a first value or a second value. In some examples, the first value may be indicative that the memory includes at least one defective memory cell, and the second value may be indicative that the memory does not include at least one defective memory cell. In such examples, the first value may enable memory repair on the memory and the second value may not enable or otherwise disable memory repair on the memory. In some examples, the first value may be a "1," a true value, an enable value, a non-zero voltage, a hot signal, or the like. The second value may be a "0," a false value, a disable value, a zero voltage, or the like.

While the memory repair unit 102 is described above as being configured to send a first value or a second value to a repair enable input of a memory, it is understood that the transmission or sending of a value may also refer to the outputting of a value on a conductive path. As an example, the memory repair unit 102 may be configured to output zero volts on a conductive path communicatively coupling a repair enable input of a memory and the memory repair unit 102. The memory may be configured to read the value output on the conductive path. For example, the memory may be configured to measure the voltage at the repair enable input relative to ground. Referring to the zero voltage output example, while the value output on the conductive path is zero volts, the memory may be configured to read or otherwise measure the value at the repair enable input as zero volts. In another example where the value output on the conductive path is non-zero voltage, the memory may be configured to read or otherwise measure the value at the repair enable input as a non-zero voltage. In this regard, reference to the memory repair unit 102 being configured to transmit or send information to a repair enable input of a memory may refer to the memory repair unit 102 being configured to output the information on a conductive path connecting the memory repair unit 102 and the repair enable input of the memory. Similarly, reference to the memory repair unit 102 being configured to output information on a conductive path that connects the memory repair unit 102 with a repair enable input of a memory may refer to the memory repair unit 102 being configured to transmit or send information to the repair enable input of the memory using the conductive path.

One or more techniques described herein may be implemented in hardware, software, firmware, or any combination thereof. For example, where one or more techniques described herein are implemented in hardware, the memory repair unit 102 may be such hardware or one component of a plurality of hardware components configured to operate together to perform one or more techniques described herein. In such examples, the hardware may be configured to execute software or firmware that may, when executed, perform one or more techniques described herein. Any software and/or firmware may be stored on a non-transitory storage medium, such on-chip memory of hardware (e.g., internal memory 105 of the processing unit 100).

In some examples, the processing unit 100 may be referred to as a processor 100. The processing unit 100 may, in some examples, be a central processing unit (CPU), a graphics processing unit (GPU), a display processing unit, a digital signal processing unit, or any other processing unit. In other examples, the processing unit 100 may be a system-on-chip (SOC) or a component of an SOC.

Figure 2:
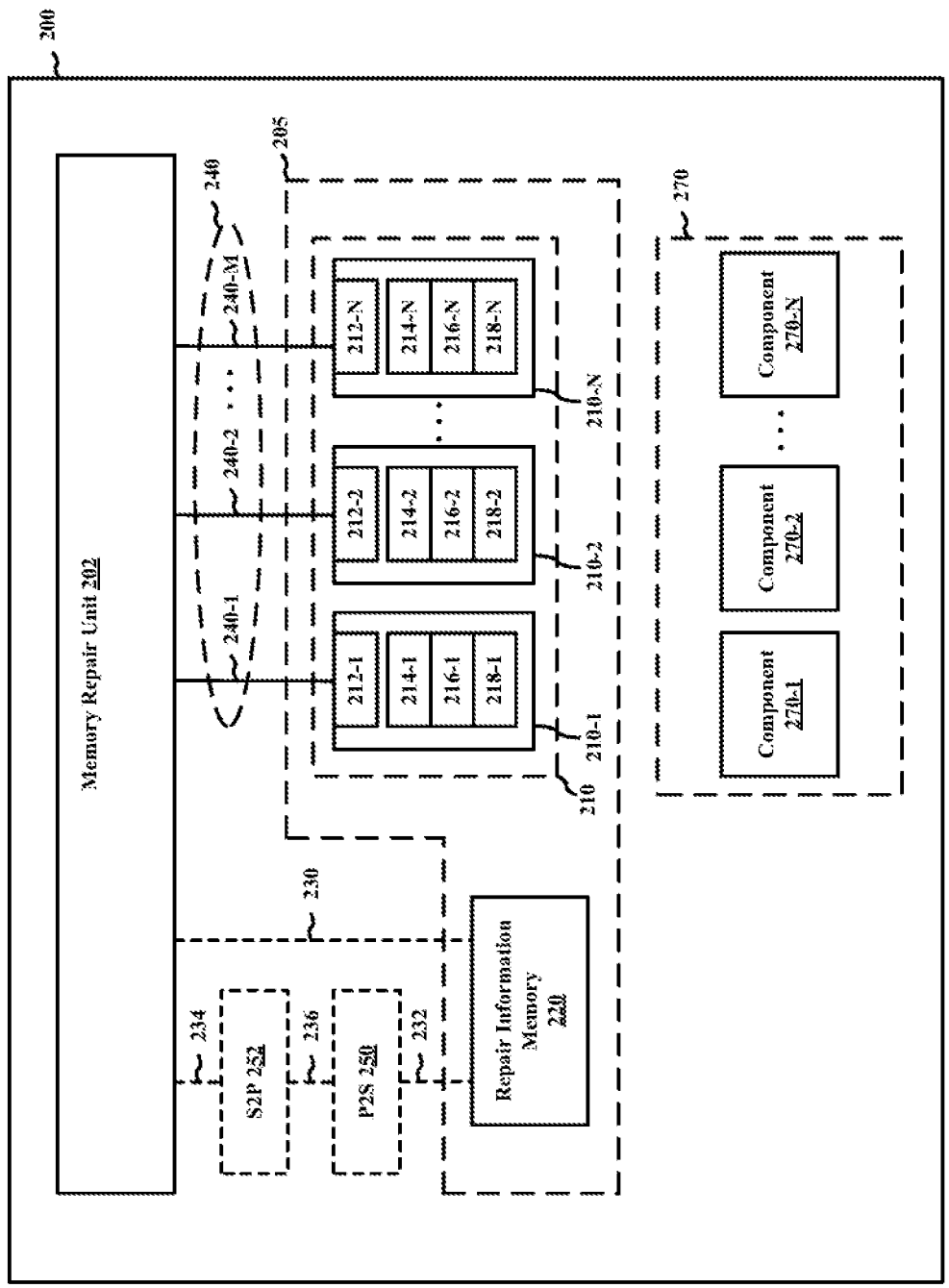
FIG. 2 is a diagram illustrating an example system-on-chip configured to perform one or more techniques of this disclosure.

FIG. 2 is a diagram illustrating an example system-on-chip (SOC) 200 configured to perform one or more techniques of this disclosure. In some examples, the SOC 200 may be referred to as an example memory system. The SOC 200 may include a memory repair unit 202 and internal memory 205. Internal memory 205 may include a plurality of memories 210 and a repair information memory 220.

In some examples, the plurality of memories 210 may include one or more volatile and/or one or more non-volatile memories. For example, the plurality of memories 110 may include read-only memory (ROM), random access memory (RAM), static RAM (SRAM), dynamic RAM (DRAM), erasable programmable ROM (EPROM), electrically erasable programmable ROM (EEPROM), Flash memory, magnetic data media, optical storage media, any other storage media, or any combination thereof. In the example of FIG. 2, the plurality of memories 210 of internal memory 205 is depicted as a first memory 210-1, a second memory 210-2, and an Nth memory 210-N, where N is a positive integer. As an example, the first memory 210-1 may be a volatile memory and the second memory 210-2 may be a non-volatile memory. As another example, the first and second memories 210-1 and 210-2 may both be volatile memories or may both be non-volatile memories. Each memory of the plurality of memories 210-1 through 210-N may be separately addressable.

In some examples, each memory of the plurality of memories 210 of internal memory 105 may respectively correspond to one or more components of a plurality of components 270 of the SOC 200. For example, each memory of the plurality of memories 210 may be communicatively coupled to one or more components of the plurality of components 270. As an example, a first memory of the plurality of memories 210 may be associated with a first component of the plurality of components 270, and a second memory of the plurality of memories 210 may be associated with a second component of the plurality of components 270.

A component of the plurality of components 270 may include any component of the SOC 200, such as any component of the SOC 200 communicatively coupled to at least one memory among the plurality of memories 210. For example, a component of the plurality of components 270 may be a CPU, a GPU, a display processing unit, a video processing unit, an audio processing unit, a digital signal processor, a video coder, a modem, a baseband processor, a Bluetooth radio modem, a Wi-Fi radio modem, a receiver, a transmitter, a camera, or any other component. As used herein, a component of the SOC 200 may also be referred to as a functional component, a functional block, an integrated circuit, or the like. For example, where a component is synonymous with a functional block, a functional block of the plurality of functional blocks 270 may be a CPU, a GPU, a display processing unit, a video processing unit, an audio processing unit, a digital signal processor, a video coder, a modem, a baseband processor, a Bluetooth radio modem, a Wi-Fi radio modem, a receiver, a transmitter, a camera, or any other functional block. In some examples, each component of the plurality of components 270 may be on a different die. In other examples, the plurality of components 270 may include at least two components that are on the same die and at least two components that are each on a different die.

In the example of FIG. 2, the plurality of components 270 is depicted as a first component 270-1, a second component 270-2, and an Nth component 270-N, where N is a positive integer. As an example, the first component 270-1 may be a CPU and the second component 270-2 may be a GPU. As another example, the first component 270-1 may be a modem (e.g., a wireless communication modem) and the second component 270-2 may be a CPU. In an example where the plurality of components 270 includes five components, the first component 270-1 may be a CPU, the second component 270-2 may be a GPU, the third component 270-3 (illustrated in FIG. 2 as being between components 270-2 and 270-N, where N is equal to or greater than five in this example) may be a display processing unit, the fourth component 270-4 (illustrated in FIG. 2 as being between components 270-2 and 270-N, where N is equal to or greater than five in this example) may be a camera, and the fifth component 270-5 (illustrated in FIG. 2 as being between components 270-2 and 270-N where N is greater than five, or as being 270-N where N is equal to five in this example) may be a wireless communication modem (e.g., a baseband processor, a Bluetooth radio modem, or a Wi-Fi radio modem such as an 802.11 radio modem).

Each component of the plurality of components 270 may be communicatively coupled to one or more memories of the plurality of memories 210. In some examples, one or more memories of the plurality of memories 210 may be communicatively coupled to only one of the components of the plurality of components 270, and/or one or more memories of the plurality of memories 210 may be communicatively coupled to two or more components of the plurality of components 270. Otherwise described, in some examples, one or more memories of the plurality of memories 210 may be shared between multiple components, and/or one or more memories of the plurality of memories 210 may not be shared between multiple components.

For example, the first component 270-1 may be communicatively coupled to a first plurality of memories and the second component 270-2 may be communicatively coupled to a second plurality of memories. Otherwise described, the first component 270-1 may be configured to write data to and/or read data from the first plurality of memories, and the second component 270-2 may be configured to write data to and/or read data from the second plurality of memories. The first and second plurality of memories are each a subset of the plurality of memories 210. In some examples, at least one memory may be the same in the first and the second plurality of memories. In other examples, the first and second plurality of memories may not include any common memory. In one example, the first plurality of memories may include memories 210-1 and 210-2, and the second plurality of memories may include memories 210-3 and 210-4. In another example, the first and second plurality of memories may both include memories 210-1 and 210-2. In another example, the first plurality of memories may include memories 210-1, 210-2, and 210-3; and the second plurality of memories may include memories 210-3 and 210-4.

The memory repair unit 202 may be configured to perform one or more techniques of memory repair described herein for the plurality of memories 210, which is described in more detail below with respect to FIGS. 3, 4A, 4B, 5A, 5B, and 6. The memory repair unit 202 may be communicatively coupled to internal memory 205. For example, the memory repair unit 202 may be communicatively coupled to the plurality of memories 210 and the repair information memory 220. In some examples, the memory repair unit 202 may be configured to receive information from the repair information memory 220. In some examples, the memory repair unit 202 may be configured to receive information from the repair information memory 220 upon the occurrence of a trigger event. For example, the repair information memory 220 may be configured to send information stored thereon to the memory repair unit 202 in response to a trigger event. In some examples, the trigger event may include power-up of the SOC 200. The memory repair unit 202 may be configured to process information received from the repair information memory 220. Based on the processing of the information received from the repair information memory 220, the memory repair unit 202 may be configured to output information to at least one memory of the plurality of memories 210 to enable memory repair on the at least one memory. In some examples, the terms "data" and "information" may be interchangeable.

In the example of FIG. 2, the memory repair unit 202 is communicatively coupled to the plurality of memories 210 via a plurality of communication connections 240. For example, the SOC 200 may be described as including a plurality of communication connections 240 for communicatively coupling the memory repair unit 202 and the plurality of memories 210. In some examples, the memory repair unit 202 may be communicatively coupled to the repair information memory 220 via communication connection 230. For example, the SOC 200 may be described as including communication connection 230 for communicatively coupling the memory repair unit 202 and the repair information memory 220. The communication connection 230 illustrates an example of a direct connection between the memory repair unit 202 and the repair information memory 220. In this example, a parallel-to-serial (P2S) converter and a serial-to-parallel converter (S2P) converter may not be present or otherwise positioned between the memory repair unit 202 and the repair information memory 220. In some examples, the communication connection 230 may represent a single conductive path, such as a single wire or a single trace. In other examples, the communication connection 230 may represent a plurality of conductive paths (e.g., 10, 100, 500, 800, 1000, or more conductive paths).

In other examples, the memory repair unit 202 may be communicatively coupled to a serial-to-parallel (S2P) converter 252 via communication connection 234 and the repair information memory 220 may be communicatively coupled to a parallel-to-serial (P2S) converter 250 via communication connection 232. For example, the SOC 200 may be described as including the S2P converter 252 and the P2S converter 250 and communication connections 232, 234, and 236. The S2P converter 252 and the P2S converter 250 may be communicatively coupled via communication connection 236. The communication connection 236 illustrates an example of a direct connection between the S2P converter 252 and the P2S converter 250. Because the S2P converter 252 and the P2S converter 250 are positioned between the memory repair unit 202 and the repair information memory 220 in this example, the memory repair unit 202 and the repair information memory 220 may be described as being indirectly communicatively coupled to each other. In some examples, the communication connections 232 and 234 may represent a number of conductive paths R, where R is a positive integer greater than 1. For example, R may be equal to 10, 100, 500, 800, or 1000. The communication connection 236 may represent a number of conductive paths S, where S is a positive integer less than R. For example, provided that S is less than R, S may be equal to 1, 2, 3, 4, 5, 6, 7, 8, 9, 10, or more. As an example, where S is equal to 1, that would mean that the communication connection 236 represents a single conductive path.

The P2S converter 250 may be configured to serialize parallel data (e.g., convert parallel data into serial data). The P2S converter 250 may include two or more inputs and one or more outputs. As an example, the P2S converter 250 may be configured to receive data on two inputs, serialize the data received on the two inputs, and output the serialized data using a single output. As another example, the P2S converter 250 may be configured to receive data on four inputs, serialize the data received on the four inputs, and output the serialized data using a single output. As another example, the P2S converter 250 may be configured to receive data on four inputs, serialize the data received on a first input and a second input of the four inputs, serialize the data received on a third input and a fourth input of the four inputs, output the serialized data corresponding to the first and second inputs using a first output, and output the serialized data corresponding to the third and fourth inputs using a second output. As another example, the P2S converter 250 may be configured to receive data on X inputs, serialize the data received on the X inputs, and output the serialized data using Y outputs, where X and Y are positive integers and Y is less than X. In this regard, the communication connection 236 may represent the Y outputs of the P2S converter 250 being communicatively coupled to inputs of the S2P converter 252.

The S2P converter 252 may be configured to perform the inverse function of the P2S converter 250. For example, the S2P converter 252 may be configured to deserialize serial data (e.g., convert serial data into parallel data). The S2P converter 252 may include one or more inputs and two or more outputs. As an example, the S2P converter 252 may be configured to receive serialized data from the P2S converter 250 on one input, deserialize the serialized data received on the input, and output the deserialized data using a two outputs. As another example, the S2P converter 252 may be configured to receive serialized data from the P2S converter 250 on one input, deserialize the serialized data received on the input, and output the deserialized data using four outputs. As another example, the S2P converter 252 may be configured to receive serialized data from the P2S converter 250 on two inputs, deserialize the serialized data received on a first input of the two inputs, deserialize the serialized data received on a second input of the two inputs, output the deserialized data corresponding to the first input using two or more outputs, and output the deserialized data corresponding to the second input using two or more outputs different from the two or more outputs used to output the deserialized data corresponding to the first input. As another example, the S2P converter 252 may be configured to receive data on X' inputs, deserialize the serialized data received on the X' inputs, and output the deserialized data using Y' outputs, where X' and Y' are positive integers and X' is less than Y'. In some examples, X may equal Y' and Y may equal X'. For example, the communication connection 236 may represent the Y outputs of the P2S converter 250 being communicatively coupled to the X' inputs of the S2P converter 252. Otherwise described, the number of inputs of the P2S converter 250 used to receive data from the repair information memory 220 may be equal to the number of outputs of the S2P converter 252 used to send deserialized data to the memory repair unit 202. Similarly, the number of outputs of the P2S converter 250 used to send serialized data to the S2P converter 252 may be equal to the number of inputs of the S2P converter 252 used to receive serialized data from the P2S converter 250.

In some examples, while two examples of communication coupling between the memory repair unit 202 and the repair information memory 220 are shown in FIG. 2, only one example may be implemented. Additionally, while two examples of communication coupling between the memory repair unit 202 and the repair information memory 220 are shown in FIG. 2, various other examples of communication coupling between the memory repair unit 202 and the repair information memory 220 may also exist but are not depicted.

Regarding the plurality of communication connections 240, each memory of the plurality of memories 210 may be separately communicatively coupled to the memory repair unit 202. As illustrated in the example of FIG. 2, the memory repair unit 202 may be communicatively coupled to the first memory 210-1 via communication connection 240-1, the memory repair unit 202 may be communicatively coupled to the second memory 210-2 via communication connection 240-2, and the memory repair unit 202 may be communicatively coupled to the Nth memory 210-N via communication connection 240-M, where M is equal to N. In some examples, each respective communication connection 240-1 through 240-M may represent a single conductive path, such as a single wire or a single trace.

As described above, a memory may refer to any memory (e.g., an integrated circuit memory, a memory chip, a memory microchip, or the like) that includes a repair enable input, one or more inputs and/or outputs, a plurality of memory cells, and one or more reserve memory cells. For example, the first memory 210-1 may include a repair enable input 212-1, one or more inputs and/or outputs 214-1, a plurality of memory cells 216-1, and one or more reserve memory cells 218-1; the second memory 210-2 may include a repair enable input 212-2, one or more inputs and/or outputs 214-2, a plurality of memory cells 216-2, and one or more reserve memory cells 218-2; and the Nth memory 210-N may include a repair enable input 212-N, one or more inputs and/or outputs 214-N, a plurality of memory cells 216-N, and one or more reserve memory cells 218-N.

In some examples, the repair information memory 220 may be configured to store defective memory address information corresponding to one or more memories of the plurality of memories 210. The defective memory address information may include a memory address corresponding to a defective memory cell in a memory, a memory address (e.g., row address) corresponding to a row of memory cells in which a defective memory cell resides in a memory, and/or a memory address (e.g., column address) corresponding to a column of memory cells in which a defective memory cell resides in a memory. As an example, if the first memory 210-1 includes a defective memory cell, then the repair information memory 220 may be configured to store memory address information corresponding to the defective memory cell in the first memory 210-1. To reduce the consumption of the repair information memory 220, information stored therein may be encoded. For example, defective memory address information may be encoded or otherwise compressed prior to storage in the repair information memory 220.

In some examples, the repair information memory 220 may be configured to store a respective memory identifier for one or more memories of the plurality of memories 210. A memory identifier may uniquely identify a memory to which the memory identifier corresponds. As an example, each memory of the plurality of memories 210 that includes at least one defective memory cell may be associated with a respective memory identifier stored in the repair information memory 220. In such an example, if a particular memory does not include a defective memory cell, then the repair information memory 220 may not be configured to store a memory identifier corresponding to the particular memory. In such an example, a memory identifier may indicate that the memory corresponding thereto includes at least one defective memory cell. For example, the plurality of memories 210 may include four memories 210-1, 210-2, 210-3, and 210-4. However, the first memory 210-1 and the second memory 210-2 may be the only memories among the plurality of memories that include at least one defective memory cell. Therefore, a first memory identifier corresponding to the first memory 210-1 may be stored in the repair information memory 220 and a second memory identifier corresponding to the second memory 210-2 may be stored in the repair information memory 220, but a memory identifier may not be stored in the repair information memory 220 for the third and fourth memories 210-3 and 210-4.

As another example, each memory of the plurality of memories 210 may be associated with a respective memory identifier regardless of whether the memory includes a defective memory cell. For example, if the plurality of memories 210 includes four memories, a first memory identifier may correspond to the first memory 210-1, a second memory identifier may correspond to the second memory 210-2, a third memory identifier may correspond to the third memory 210-3, and a fourth memory identifier may correspond to the fourth memory 210-4. The repair information memory 220 may be configured to store a data structure that includes each memory identifier that corresponds to a memory that includes at least one defective memory cell. In this example, if only the third memory 210-3 among the four memories includes at least one defective memory cell, then the data structure may only include the third memory identifier. In such an example, a memory identifier included in the data structure may indicate that the memory corresponding the memory identifier includes at least one defective memory cell. In some examples, the data structure may be referred to as a memory defect data structure that includes information that identifies one or more memories among the plurality of memories 210 that include at least one defective memory cell. The information may, for example, include a memory identifier.

In some examples, a memory identifier may be a plurality of bits in length. For example, a memory identifier may be N bits in length (where N is an integer greater than 1), which may be described as the number of bits used to represent a memory identifier. As another example, as described in more detail below, N may be determined based on an algorithm, such as a log base 2 algorithm. As another example, N may be a fixed number of bits. In such an example, N may be greater than $\log_2(x)$, where x may be equal to the total number of memories of the plurality of memories 210 or the number of memories that include at least one defective memory cell. For example, N may be equal to any number greater than $\log_2(x)$. For example, where the plurality of memories 210 includes four memories, instead of using two bits to uniquely represent the four memories, N may be greater than two. In one example where N=4, the first, second, third, and fourth memory identifiers respectively corresponding to first, second, third, and fourth memories may have the following respect values: 1000, 0100, 0010, and 0001. In some examples, N may be equal to the total number of memories of the plurality of memories 210.

In some examples, the number of bits used to represent a memory identifier may be derived using an algorithm, such as a log base 2 algorithm. The log base 2 algorithm may be defined as $\log_2(x)=z$, where z is the result $\log_2(x)$ and x may be equal to the total number of memories of the plurality of memories 210 or the number of memories that include at least one defective memory cell. In some examples, the result of z may be rounded up to the nearest integer. For example, if the plurality of memories 210 includes 1012 memories, then $\log_2(1012)=9.983$, the result of which may be rounded to 10. The value of 10 may represent the number of bits used to identify each memory of the plurality of memories 210. As another example, if the plurality of memories 210 includes 52 memories, then $\log_2(52)=5.7$, the result of which may be rounded to 6. The value of 6 may represent the number of bits used to identify each memory of the plurality of memories 210. As one example, the plurality of memories 210 may include memories 210-1, 210-2, 210-3, and 210-4. $\log_2(4)=2$, meaning that 2 bits may be used as a memory identifier for each of the memories. In this example, a first memory identifier corresponding to the first memory 210-1 may be the binary number 00, a second memory identifier corresponding to the second memory 210-2 may be the binary number 01, a third memory identifier corresponding to the third memory 210-3 may be the binary number 10, and a fourth memory identifier corresponding to the fourth memory 210-4 may be the binary number 11. Similarly, if the number of memories that include at least one defective memory cell is 60, $\log_2(60)=5.907$, the result of which may be rounded to 6. The value of 6 may represent the number of bits used to identify each memory of the plurality of memories 210 that includes at least one defective memory cell.

Referring to a repair enable input of a memory, the repair enable input may be configured to inform the memory that the memory includes at least one defective memory cell. For example, the memory repair unit 202 may be configured to send information to a repair enable input of a memory to inform the memory that the memory includes at least one defective memory cell. Otherwise described, the repair enable input may be configured to enable memory repair on the memory because the memory includes at least one defective memory cell. For example, the memory repair unit 202 may be configured to send information to a repair enable input of a memory to enable memory repair on the memory because the memory includes at least one defective memory cell.

In some examples, the information sent by the memory repair unit 202 to a repair enable input of a memory may be a first value or a second value. In some examples, the first value may be indicative that the memory includes at least one defective memory cell, and the second value may be indicative that the memory does not include at least one defective memory cell. In such examples, the first value may enable memory repair on the memory and the second value may not enable or otherwise disable memory repair on the memory. In some examples, the first value may be a "1," a true value, an enable value, a non-zero voltage, a hot signal, or the like. The second value may be a "0," a false value, a disable value, a zero voltage, or the like.

While the memory repair unit 202 is described above as being configured to send a first value or a second value to a repair enable input of a memory, it is understood that the transmission or sending of a value may also refer to the outputting of a value on a conductive path. As an example, the memory repair unit 202 may be configured to output zero volts on a conductive path communicatively coupling a repair enable input of a memory and the memory repair unit 202. The memory may be configured to read the value output on the conductive path. For example, the memory may be configured to measure the voltage at the repair enable input relative to ground. Referring to the zero voltage output example, while the value output on the conductive path is zero volts, the memory may be configured to read or otherwise measure the value at the repair enable input as zero volts. In another example where the value output on the conductive path is non-zero voltage, the memory may be configured to read or otherwise measure the value at the repair enable input as a non-zero voltage. In this regard, reference to the memory repair unit 202 being configured to transmit or send information to a repair enable input of a memory may refer to the memory repair unit 202 being configured to output the information on a conductive path connecting the memory repair unit 202 and the repair enable input of the memory. Similarly, reference to the memory repair unit 202 being configured to output information on a conductive path that connects the memory repair unit 202 with a repair enable input of a memory may refer to the memory repair unit 202 being configured to transmit or send information to the repair enable input of the memory using the conductive path.

One or more techniques described herein may be implemented in hardware, software, firmware, or any combination thereof. For example, where one or more techniques described herein are implemented in hardware, the memory repair unit 202 may be such hardware or one component of a plurality of hardware components configured to operate together to perform one or more techniques described herein. In such examples, the hardware may be configured to execute software or firmware that may, when executed, perform one or more techniques described herein. Any software and/or firmware may be stored on a non-transitory storage medium, such on-chip memory of hardware (e.g., internal memory 105 of the SOC 200).

Figure 3:
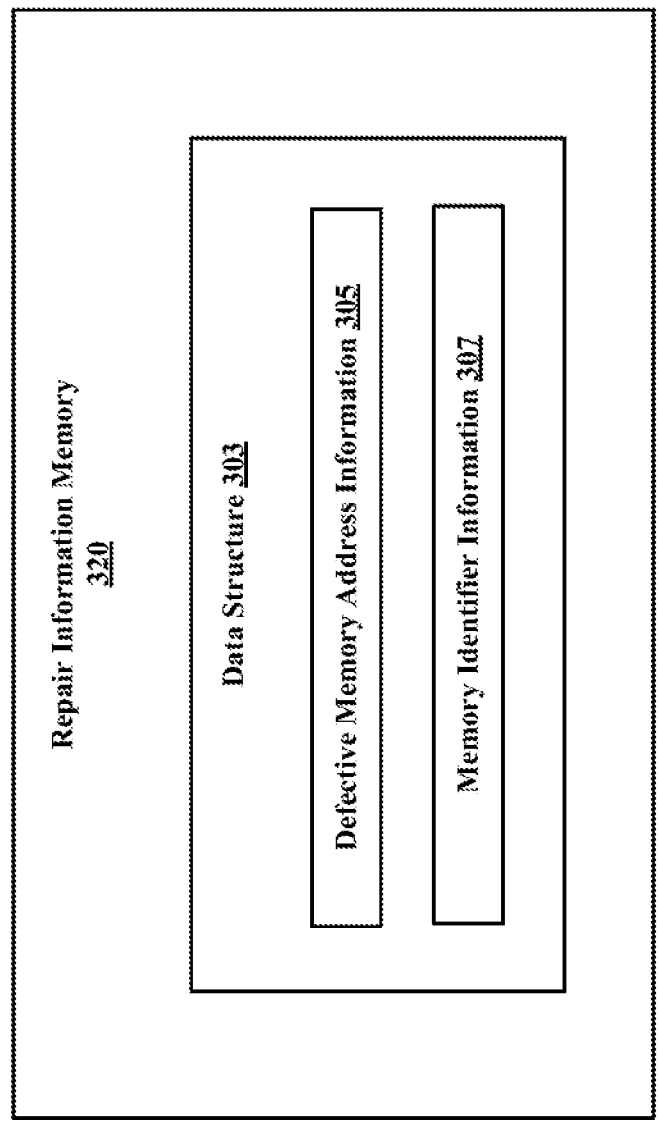
FIG. 3 illustrates an example data structure for a repair information memory in accordance with one or more techniques of this disclosure.

FIG. 3 illustrates an example data structure for a repair information memory 320 in accordance with the techniques described herein. The repair information memory 320 may be any repair information memory described herein, such as repair information memory 120 or repair information memory 220.

In the example of FIG. 3, the repair information memory 320 includes a data structure 303. The data structure 303 may include defective memory address information 305. The defective memory address information 305 may include one or more defective memory address corresponding to one or more memories. For example, where the repair information memory 320 is the repair information memory 120, the defective memory address information 305 may include one or more defective memory addresses corresponding to one or more memories of the plurality of memories 110. As another example, where the repair information memory 320 is the repair information memory 220, the defective memory address information 305 may include one or more defective memory addresses corresponding to one or more memories of the plurality of memories 210. A defective memory address may include a memory address corresponding to a defective memory cell in a memory, a memory address (e.g., row address) corresponding to a row of memory cells in which a defective memory cell resides in a memory, and/or a memory address (e.g., column address) corresponding to a column of memory cells in which a defective memory cell resides in a memory.

The data structure 303 may include memory identifier information 307. The memory identifier information 307 may include a memory identifier corresponding to each memory that includes at least one defective memory cell. For example, where the repair information memory 320 is the repair information memory 120, the memory identifier information 307 may include one or more memory identifiers corresponding to one or more memories of the plurality of memories 110 that include at least one defective memory cell. As another example, where the repair information memory 320 is the repair information memory 220, the memory identifier information 307 may include one or more memory identifiers corresponding to one or more memories of the plurality of memories 210 that include at least one defective memory cell.

Figure 4A:
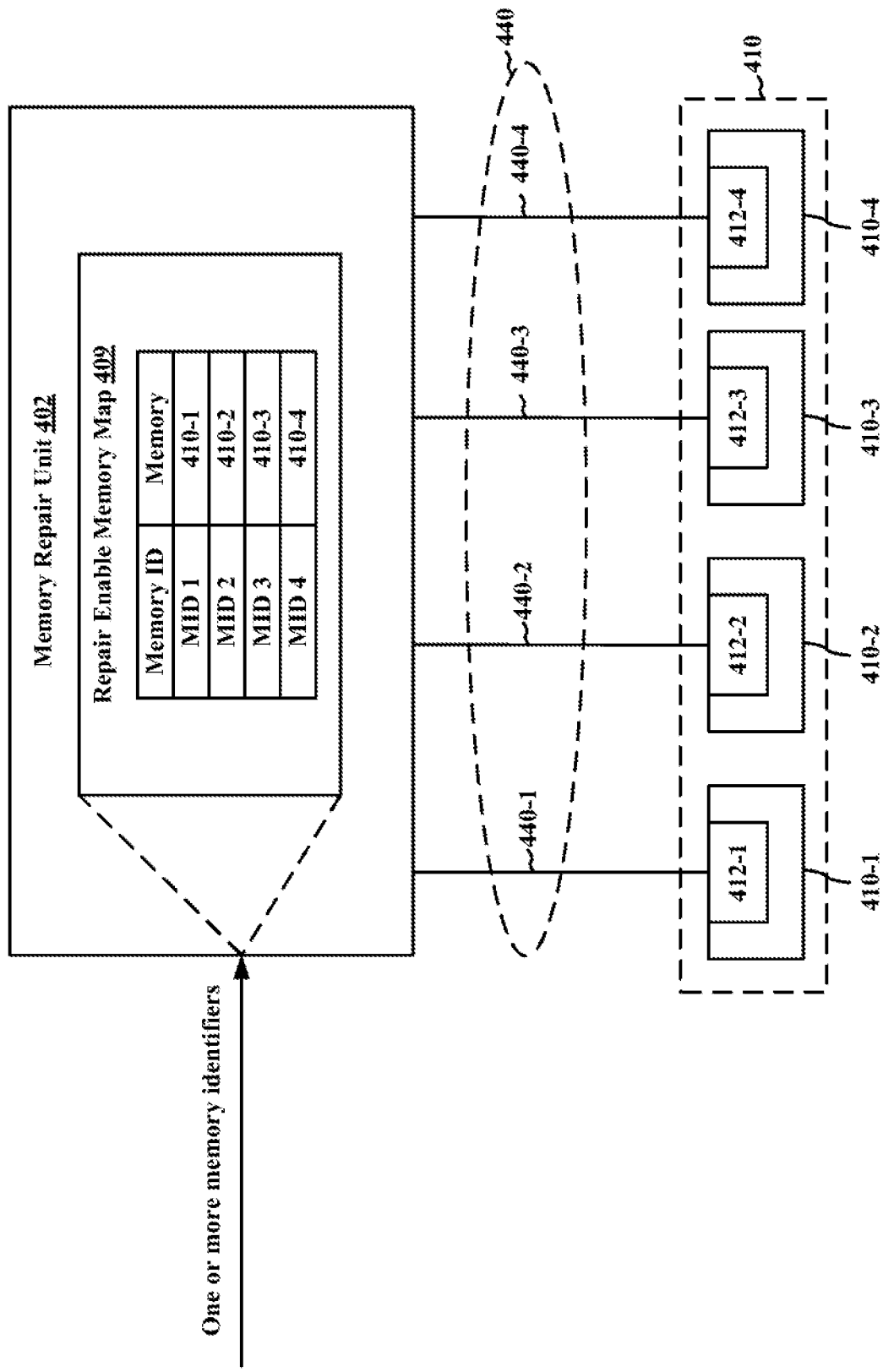
FIG. 4A illustrates an example memory repair unit in accordance with one or more techniques of this disclosure.

FIG. 4A illustrates an example memory repair unit 402 in accordance with one or more techniques of this disclosure. The memory repair unit 402 may be any memory repair unit described herein, such as memory repair unit 102 or memory repair unit 202. Similarly, like reference numbers in FIGS. 4A and 4B may correspond to like reference numbers in other figures, such as FIGS. 1 and 2. For example, the plurality of communication connections 440 may be the plurality of communication connections 140 or the plurality of communication connections 240. As another example, the plurality of memories 410 may be the plurality of memories 110 or the plurality of memories 210.

In the example of FIG. 4A, the memory repair unit 402 may be configured to receive one or more memory identifiers. The one or more memory identifiers correspond to one or more memories of the plurality of memories 410. The memory repair unit 402 may be configured to determine which memory among the plurality of memories 410 corresponds to each received memory identifier. In some examples, such as in the depicted example of FIG. 4A, the memory repair unit 402 may be configured to determine which memory corresponds to a received memory identifier by using a repair enable memory map 409. The repair enable memory map 409 may be considered a look-up table that maps the input (e.g., a memory identifier) to a particular memory. For example, the memory repair unit 402 may be configured to input a particular received memory identifier into the repair enable memory map 409 to determine the memory corresponding to the particular received memory identifier. The repair enable memory map 409 may include a mapping for each memory of the plurality of memories 410, meaning that the repair enable memory map 409 may map a memory identifier to each memory of the plurality of memories 410. In the example shown, the plurality of memories 410 includes four memories, which are mapped to corresponding memory identifies MID 1, 2, 3, and 4. MID is an acronym for memory identifier. Each MID may be a binary value defined by a number of bits. For example, MID 1 may be 00, MID 2 may be 01, MID 3 may be 10, and MID 4 may be 11.

In response to determining (e.g., identifying) a memory that corresponds to a received memory identifier, the memory repair unit 402 may be configured to output a value to a repair enable input of the memory to enable memory repair on the memory. A memory for which memory repair is enabled may be configured to use one or more reserve memory cells in place of one or more defective memory cells. Enabling memory repair on a memory may inform the memory that the memory includes at least one defective memory cell.

As one example, assume memory repair unit 402 receives MID 1 and MID 4. The memory repair unit 402 may be configured to determine that the memory 410-1 corresponds to MID 1, and that the memory 410-4 corresponds to MID 4. The memory repair unit 402 may be configured to determine that the memory 410-1 corresponds to MID 1 by using the repair enable memory map 409. For example, the memory repair unit 402 may be configured to input MID 1 into the repair enable memory map 409 to determine the memory corresponding to MID 1 is memory 410-1. Similarly, the memory repair unit 402 may be configured to determine that the memory 410-4 corresponds to MID 4 by using the repair enable memory map 409. For example, the memory repair unit 402 may be configured to input MID 4 into the repair enable memory map 409 to determine the memory corresponding to MID 4 is memory 410-4. In response to determining that memory 410-1 corresponds to MID 1, the memory repair unit 402 may be configured to output a first value to a repair enable input 412-1 of the memory 410-1 to enable memory repair on the memory 410-1. Similarly, in response to determining that memory 410-4 corresponds to MID 4, the memory repair unit 402 may be configured to output a second value to a repair enable input 412-4 of the memory 410-4 to enable memory repair on the memory 410-4. The first and second values may be the same with the exception that the first value is output to the repair enable input 412-1 of the memory 410-1 and the second value is output to the repair enable input 412-4 of the memory 410-4.

In some examples, the memory repair unit 402 may be configured to output the first and second values in parallel. In such examples, the memory repair unit 402 may be configured to output the first value and the second value in the order that the memory identifiers are received and processed. For example, the memory repair unit 402 may be configured to serially input a plurality of memory identifiers into the repair enable memory map 409. In such an example, the memory repair unit 402 may be configured to serially output a value to each repair enable input corresponding to each memory for which a memory identifier was received. However, the memory repair unit 402 may also be configured to maintain each output. In some examples, the memory repair unit 402 may be configured to maintain each output for a period of time. In such examples, the period of time may be a fixed period of time or a default period of time. In other examples, the memory repair unit 402 may be configured to maintain each output until the occurrence of a trigger event. In such examples, the trigger event may include loss of power to the memory repair unit 402. The trigger event may include the powering down of the memory repair unit 402 or the memory system in which the memory repair unit 402 is implemented. The trigger event may include the completion of a timer (whether counting down to a certain value or counting up to a certain value). The trigger event may be different from the examples of trigger events described herein. Therefore, while each output may occur serially, the maintaining of each output may result in the memory repair unit 402 being configured to output a plurality of values in parallel. For example, the memory repair unit 402 may be configured to output the first value to the repair enable input 412-1 before outputting the second value to the repair enable input 412-4, and the memory repair unit 402 may be configured to output the second value to the repair enable input 412-4 after outputting the first value to the repair enable input 412-1. However, the memory repair unit 402 may be configured to maintain the outputting of the first value resulting in the second value being output in parallel with the first value even though the second value may have been output serially output relative to the outputting of the first value.

In some examples, the memory repair unit 402 may be configured to output a default value to the repair enable input corresponding to each memory for which a memory identifier was not received by the memory repair unit 402. The default value may disable memory repair on each memory not needing repair. For example, the memory repair unit 402 may not receive MID 2 and MID 3. In response to not receiving the MID 2 and MID 3, the memory repair unit 402 may be configured to output a default value to each of the repair enable inputs 412-2 and 412-3 of the memories 410-2 and 410-3, respectively.

In other examples, the memory repair unit 402 may be configured to not output any value to the repair enable input corresponding to each memory for which a memory identifier was not received by the memory repair unit 402. By not outputting a value, the repair enable input correspond to each of such memories may be at a default value (e.g., 0 volts), resulting in memory repair being disabled on such memories. For example, the memory repair unit 402 may not receive MID 2 and MID 3. In response to not receiving the MID 2 and MID 3, the memory repair unit 402 may be configured to not output any value to each of the repair enable inputs 412-2 and 412-3 of the memories 410-2 and 410-3, respectively. As a result, memory repair may be disabled for memories 410-2 and 410-3.

Figure 4B:
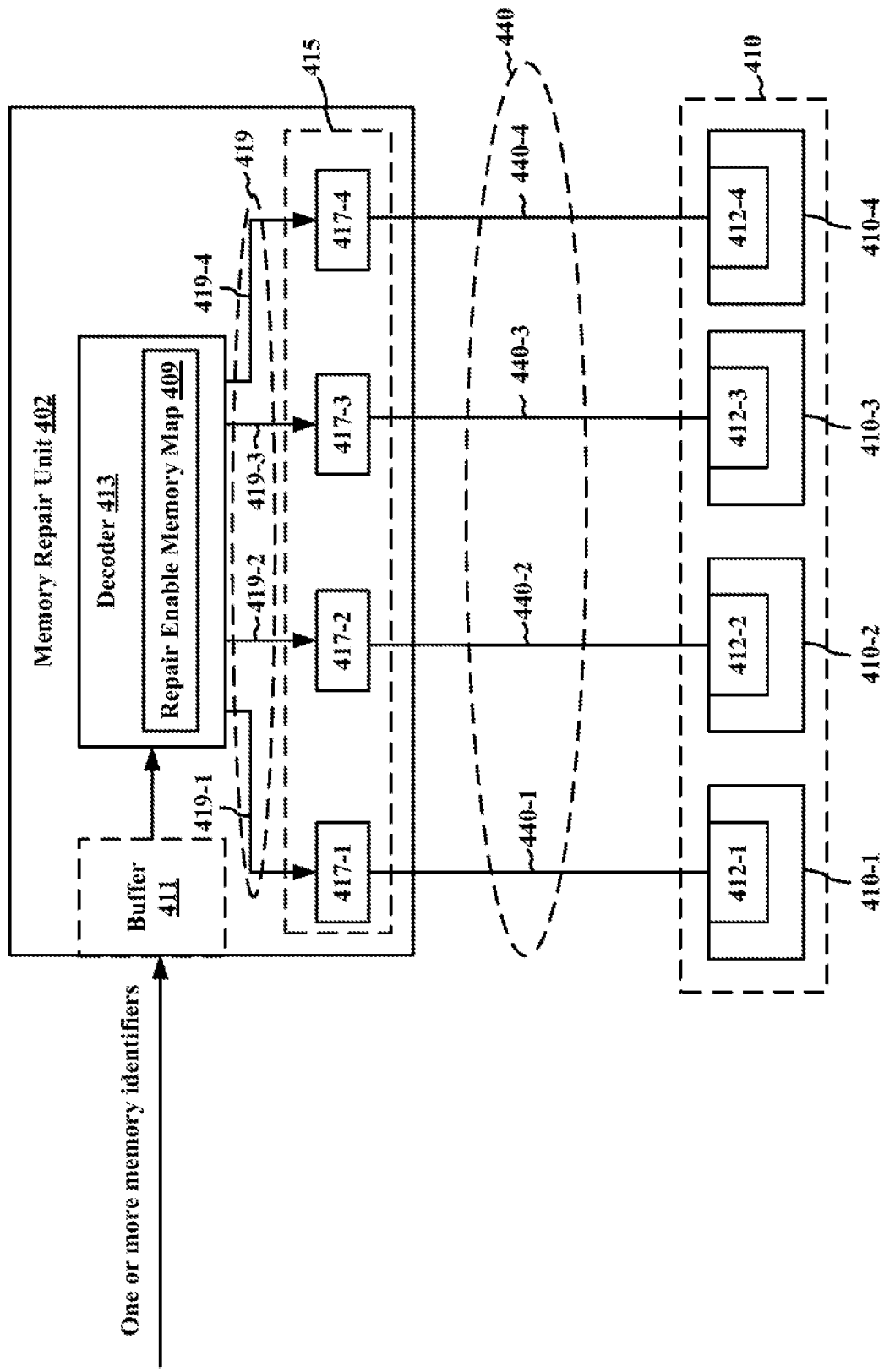
FIG. 4B illustrates an example memory repair unit in accordance with one or more techniques of this disclosure.

FIG. 4B illustrates an example memory repair unit 402 in accordance with one or more techniques of this disclosure. As described above, the memory repair unit 402 may be any memory repair unit described herein, such as memory repair unit 102 or memory repair unit 202.

In the example of FIG. 4B, the memory repair unit 402 includes a buffer 411, a decoder 413, and an accumulator 415. The buffer 411 may be communicatively coupled to the decoder 413, and the decoder 413 may be communicatively coupled to the accumulator 415. The decoder 413 may include a plurality of accumulator conductive paths 419. The decoder 413 may include a plurality of outputs, where each output is communicatively coupled to a respective accumulator conductive path of the plurality of conductive paths 419. For example, each output and each accumulator conductive path may correspond to a respective memory of the plurality of memories 410.

In the example shown, the plurality of memories 410 includes four memories. Therefore, the plurality of accumulator conductive paths 419 may include an accumulator conductive path corresponding to each memory, such as a first accumulator conductive path 419-1 corresponding to the first memory 410-1, a second accumulator conductive path 419-2 corresponding to the second memory 410-2, a third accumulator conductive path 419-3 corresponding to the third memory 410-3, and a fourth accumulator conductive path 419-4 corresponding to the fourth memory 410-4. Each accumulator conductive path of the plurality of conductive paths 419 may be communicatively coupled to storage circuit of the accumulator 415 to store the output by the decoder on that particular accumulator conductive path. In some examples, the storage circuit may be a latch circuit, a flip-flop circuit (e.g., a data flip-flop circuit, often referred to as a D flip-flop), or any other storage circuit. The term storage circuit may also be referred to as an accumulator circuit in some examples. Each storage circuit may include an output communicatively coupled to the repair enable input of memory with which the storage circuit is associate. As an example, the accumulator conductive path 419-1 may communicatively couple a first output of the decoder 413 to an input of the first storage circuit 417-1 of the accumulator 415. The accumulator conductive path 419-2 may communicatively couple a second output of the decoder 413 to an input of the second storage circuit 417-2 of the accumulator 415. The accumulator conductive path 419-3 may communicatively couple a third output of the decoder 413 to an input of the third storage circuit 417-3 of the accumulator 415. The accumulator conductive path 419-4 may communicatively couple a fourth output of the decoder 413 to an input of the fourth storage circuit 417-4 of the accumulator 415.

Each storage circuit of the accumulator 415 may be configured to receive a value output by the decoder 413 on the corresponding accumulator conductive path. Each storage circuit of the accumulator 415 may be configured to output the stored value on a conductive path communicatively coupling the memory repair unit 402 (e.g., the storage circuit of the memory repair unit 402) to the repair enable input of a memory. For example, the conductive path 440-1 may communicatively couple the output of the storage circuit 417-1 to the repair enable input 412-1 of the memory 410-1. The conductive path 440-2 may communicatively couple the output of the storage circuit 417-2 to the repair enable input 412-2 of the memory 410-2. The conductive path 440-3 may communicatively couple the output of the storage circuit 417-3 to the repair enable input 412-3 of the memory 410-3. The conductive path 440-4 may communicatively couple the output of the storage circuit 417-4 to the repair enable input 412-4 of the memory 410-4.

In some examples, the buffer 411 may be a shift register. The buffer 411 may be configured to receive one or more memory identifiers. The buffer 411 may be configured to store any received memory identifier. In some examples, the buffer 411 may be configured to receive the one or more memory identifiers in parallel. In other examples, the buffer 411 may be configured to serially receive the one or more memory identifiers. In either of such examples, the buffer 411 may be configured to serially output the one or more memory identifiers stored in the buffer 411 to the decoder 413. For example, if the one or more memory identifiers are each P bits in length (where P is a positive integer), the buffer 411 may output each of the P bits across P conductive paths (e.g., one conductive path for each bit) to the decoder 413 in parallel. Therefore, while bits corresponding to the same memory identifier may be output in parallel from the buffer 411, the buffer 411 may be configured to serially output each received memory identifier to the decoder 413.

In some examples, the buffer 411 may be configured to receive a clock signal. In such examples, the buffer 411 may be configured to output P bits corresponding to each memory identifier stored in the buffer 411 on a per clock cycle basis. For example, each output of the buffer 411 may be controlled by the clock signal. As an example, if the buffer 411 is storing two memory identifiers, the buffer 411 may be configured to output the first memory identifier based on a first clock cycle (e.g., in response to a first clock cycle), and may be configured to output the second memory identifier based on a second clock cycle (e.g., in response to a second clock cycle) following the first clock cycle. As described above, the buffer 411 may be a shift register. In such an example, the buffer 411 may be referred to as shift register 411. The shift register 411 may be configured to output the first memory identifier based on a first clock cycle (e.g., in response to a first clock cycle). The shift register 411 may be configured to shift the second memory identifier into the output position in the shift register based on a second clock cycle (e.g., in response to a second clock cycle). The shift register 411 may be configured to output the second memory identifier based on a third clock cycle (e.g., in response to a third clock cycle). The second clock cycle may follow the first clock cycle, and the third clock cycle may follow the second clock cycle. In some examples, the first and second clock cycles may be adjacent to each other in the clock signal, and the second and third clock cycles may be adjacent to each other in the clock signal.

In some examples, the shift register 411 may be configured to output information (e.g., P bits corresponding to a first memory identifier) and shift the information (e.g., P bits corresponding to a second memory identifier) in the shift register to the output location. In some examples, these two actions may occur based on a single clock cycle. In other examples, the outputting of information may occur based on a first clock cycle and the shifting of information may occur based on a second clock cycle.

Referring to the decoder 413, the decoder 13 may be configured to receive each memory identifier stored in the buffer 411. For example, the decoder 413 may be configured to serially receive each memory identifier stored in the buffer 411. As described above, even though the decoder 413 may be configured to serially receive each memory identifier, the decoder 413 may be configured to receive each bit corresponding to each memory identifier in parallel.

The decoder 413 may be configured to determine which memory among the plurality of memories 410 corresponds to each received memory identifier. In some examples, such as in the depicted example of FIG. 4B, the memory repair unit 402 may be configured to determine which memory corresponds to a received memory identifier by using a repair enable memory map 409. The repair enable memory map 409 may be considered a look-up table that maps the input (e.g., a memory identifier) to a particular memory. For example, the decoder 413 may be configured to input a particular received memory identifier into the repair enable memory map 409 to determine the memory corresponding to the particular received memory identifier. The repair enable memory map 409 may include a mapping for each memory of the plurality of memories 410, meaning that the repair enable memory map 409 may map a memory identifier to each memory of the plurality of memories 410. In the example shown, the plurality of memories 410 includes four memories, which are mapped to corresponding memory identifies MID 1, 2, 3, and 4 (the more detailed version of the repair enable memory map 409 is depicted in FIG. 4A). Each MID may be a binary value defined by a number of bits. For example, MID 1 may be 00, MID 2 may be 01, MID 3 may be 10, and MID 4 may be 11.

In response to determining (e.g., identifying) a memory that corresponds to a received memory identifier, the decoder 413 may be configured to output a value to a storage circuit of the accumulator 415 corresponding to the memory. As described above, the storage circuit is communicatively coupled to the repair enable input of the memory. Based on the value output by the storage circuit to the repair enable input of the memory, the memory may be configured to enable or disable memory repair. For example, if the value output by the storage circuit is indicative that the memory includes at least one defective memory cell, then the memory may be configured to enable memory repair. However, if the value output by the storage circuit is indicative that the memory does not include at least one defective memory cell, then the memory may be configured to disable memory repair. As described herein, a memory for which memory repair is enabled may be configured to use one or more reserve memory cells in place of one or more defective memory cells. Enabling memory repair on a memory may inform the memory that the memory includes at least one defective memory cell.

As one example, assume the decoder 413 receives MID 1. The decoder 413 may be configured to determine that the memory 410-1 corresponds to MID 1. The decoder 413 may be configured to determine that the memory 410-1 corresponds to MID 1 by using the repair enable memory map 409. For example, the decoder 413 may be configured to input MID 1 into the repair enable memory map 409 to determine the memory corresponding to MID 1 is memory 410-1. In response to determining that memory 410-1 corresponds to MID 1, the decoder 413 may be configured to output a first value on the accumulator conductive path 419-1. The storage circuit 417-1 may be configured to receive the first value and store the first value. The storage circuit 417-1 may be configured to output the stored value to the repair enable input 412-1 of the memory 410-1 to enable memory repair on the memory 410-1.

As used herein, a value output by a decoder described herein may, according to some examples, include a first value or a second value. In some examples, a first value may be a "1," a true value, an enable value, a non-zero voltage, a hot signal, or the like. A second value may be a "0," a false value, a disable value, a zero voltage, or the like. While a decoder may be described as being configured to send a value (e.g., to an accumulator), it is understood that the transmission or sending of a value may also refer to the outputting of a value on a conductive path.

As used herein, a value output by an accumulator (e.g., a storage circuit of an accumulator) may, according to some examples, a first value or a second value. In some examples, a first value may be a "1," a true value, an enable value, a non-zero voltage, a hot signal, or the like. A second value may be a "0," a false value, a disable value, a zero voltage, or the like. While an accumulator (e.g., a storage circuit of an accumulator) may be described as being configured to send a value (e.g., to a memory, such as a repair enable input of a memory), it is understood that the transmission or sending of a value may also refer to the outputting of a value on a conductive path.

As used herein, a value output by a memory repair unit may, according to some examples, a first value or a second value. In some examples, a first value may be a "1," a true value, an enable value, a non-zero voltage, a hot signal, or the like. A second value may be a "0," a false value, a disable value, a zero voltage, or the like. While a memory repair unit may be described as being configured to send a value (e.g., to a memory, such as a repair enable input of a memory), it is understood that the transmission or sending of a value may also refer to the outputting of a value on a conductive path.

After determining the received MID 1 correspond to the memory 410-1 and/or outputting the first value on the accumulator conductive path 419-1, the decoder 413 may receive MID 4. The decoder 413 may be configured to determine that the memory 410-4 corresponds to MID 4. The decoder 413 may be configured to determine that the memory 410-4 corresponds to MID 4 by using the repair enable memory map 409. For example, the decoder 413 may be configured to input MID 4 into the repair enable memory map 409 to determine the memory corresponding to MID 4 is memory 410-4. In response to determining that memory 410-4 corresponds to MID 4, the decoder 413 may be configured to output a second value on the accumulator conductive path 419-4. The storage circuit 417-4 may be configured to receive the second value and store the second value. The first and second values may be the same with the exception that the first value is output to storage circuit 417-1 corresponding to the memory 410-1 and the second value is output to the storage circuit 417-4 corresponding to the memory 410-4. The storage circuit 417-4 may be configured to output the stored value to the repair enable input 412-4 of the memory 410-4 to enable memory repair on the memory 410-1.

In some examples, the decoder 413 may be configured to output the first and second values in serial. For example, the decoder 413 may be configured to output a value on a single output at a time. Referring to the MID 1 and MID 4 example above, the decoder 413 may not be configured to output the first value and the second value in parallel. However, the accumulator 415 may be configured to enable the decoder 413 to serially output values. For example, as described above, the accumulator includes a storage circuit corresponding to each memory, and each storage circuit of the accumulator 415 may be configured to store a received value. As an example, each storage circuit may be configured to store a true value and maintain the storage of the true value even if a false value is subsequently received. Otherwise described, each storage circuit of the accumulator 415 may be configured to not overwrite a stored true value upon receiving a false value. In this example, even though the decoder 413 may be outputting a false value to a storage circuit that had previously received a true value, the storage circuit does not store the false value. Instead, the storage circuit maintains storage of the true value and may continue to output the true value (e.g., until the occurrence of a trigger event) to the repair enable input of the memory corresponding thereto. In some examples, each storage circuit of the accumulator 415 may be configured to maintain its respective output for a period of time. In such examples, the period of time may be a fixed period of time or a default period of time. In other examples, each storage circuit of the accumulator 415 may be configured to maintain each output until the occurrence of a trigger event. In such examples, the trigger event may include loss of power to the accumulator 415. The trigger event may include the powering down of the accumulator 415 or the memory system in which the accumulator 415 is implemented. The trigger event may include the completion of a timer (whether counting down to a certain value or counting up to a certain value). The trigger event may be different from the examples of trigger events described herein.

Referring to the MID 1 and MID 4 example above, the first and second values may each be an example of a true value. For example, in response to determining that memory 410-4 corresponds to MID 4, the decoder 413 may be configured to output a second value on the accumulator conductive path 419-4. However, since the decoder 413 may not be configured to output the second value in parallel with the first value, the decoder 413 may not output the first value to the storage circuit 417-1 upon the decoder 413 outputting the second value to the storage circuit 417-4. As a result, the value at the input of the storage circuit 417-1 may change from the first value (e.g., a true value) to another value (e.g., a false value). In this example, the storage circuit 417-1 may be configured to not store the false value; and, instead, the storage circuit 417-1 may be configured to maintain storage of the first value. In this manner, the accumulator 415 may be configured to accumulate a plurality of values serially output by the decoder 413. Otherwise described, while the decoder 413 may be configured to output values destined for different memories in a serial fashion, the accumulator 415 may be configured to accumulate the values serially output by the decoder 413 and output the accumulated values destined for different memories in parallel.

In some examples, the decoder 413 may be configured to output a default value to the storage circuit corresponding to each memory for which a memory identifier was not received by the decoder 413. The default value may disable memory repair on each of such memories. For example, the decoder 413 may not receive MID 2 and MID 3. In response to not receiving the MID 2 and MID 3, the decoder 413 may be configured to output (e.g., serially output) a default value to the input of the storage circuit 417-2 and the input of the storage circuit 417-3. In one example, a true value may correspond to a positive voltage and a false value may correspond to a negative voltage. In such an example, the first and second values respectively output by the decoder 413 to the storage circuit 417-1 and the storage circuit 417-4 may each be an example of a true value.

In other examples, the decoder 413 may be configured to not output any value to the storage circuit corresponding to each memory for which a memory identifier was not received by the decoder 413. By not outputting a value, the repair enable input correspond to each of such memories may be at a default value (e.g., 0 volts). For example, the storage circuit corresponding to each memory for which a memory identifier was not received by the decoder 413 may store the default value and output the default value to the input corresponding to the memory with which the storage circuit is associated. For example, the decoder 413 may not receive MID 2 and MID 3. In response to not receiving the MID 2 and MID 3, the memory repair unit 402 may be configured to not output any value to each of the storage circuit 417-2 and the storage circuit 417-3. The storage circuit 417-2 may output the default value to the repair enable input 412-2 of the memory 410-2. Similarly, the storage circuit 417-3 may output the default value to the repair enable input 412-3 of the memory 410-3. As a result, the memory repair may be disabled for memories 410-2 and 410-3.

Figure 5A:
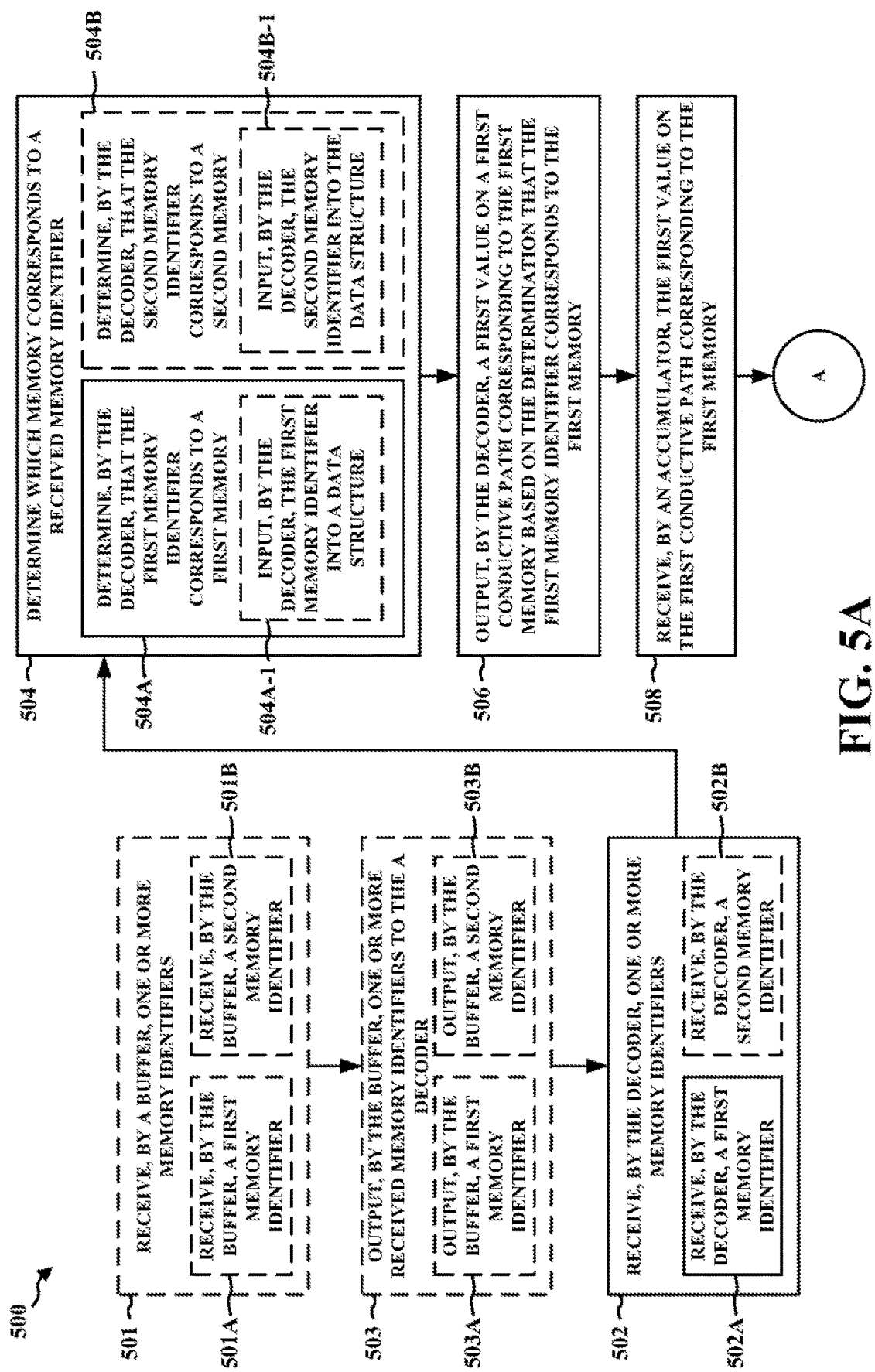

FIGS. 5A and 5B illustrate an example flowchart 500 of a method of memory repair in accordance with one or more techniques of this disclosure. The method may be performed by a memory repair unit (or one or more components of the memory repair unit) of a processing unit (e.g., processing unit 100) or an SOC (e.g., SOC 200), such as memory repair unit 102, memory repair unit 202, or memory repair unit 402. In some examples, the method illustrated in flowchart 500 may include one or more functions described herein (e.g., one or more functions described with respect to FIGS. 1, 2, 3, 4A, and/or 4B) that are not illustrated in FIGS. 5A and 5B, and/or may exclude one or more illustrated functions.

At block 502, a decoder of the memory repair unit may be configured to receive one or more memory identifiers. The one or more memory identifiers may be stored in a memory (e.g., a repair information memory) communicatively coupled to the memory repair unit. For example, the decoder may be configured to receive the one or more identifiers from the memory. Each received memory identifier may respectively correspond to a memory of a plurality of memories communicatively coupled to the memory repair unit. In some examples, reference to the plurality of memories being communicatively coupled to the memory repair unit may refer to the plurality of memories being communicatively coupled to an accumulator of the memory repair unit. In some examples, reference to the plurality of memories being communicatively coupled to the accumulator of the memory repair unit may refer to each memory of the plurality of memories being communicatively coupled to a respective storage circuit of the accumulator. The term storage circuit may also be referred to as an accumulator circuit in some examples. For example, if the plurality of memories includes 50 memories, then the accumulator may include 50 storage circuits, one storage circuit for each memory of the 50 memories. For example, the first memory (e.g., a repair enable input of the first memory) of the 50 memories may be communicatively coupled to an output of the first storage circuit, and the fiftieth memory (e.g., a repair enable input of the fiftieth memory) of the 50 memories may be communicatively coupled to an output of the fiftieth storage circuit.

In the example shown, the decoder may be configured to receive a first memory identifier at block 502A. The first memory identifier may correspond to a first memory. The first memory may be a memory of the plurality of memories communicatively coupled to the memory repair unit. The decoder may be configured to receive a second memory identifier at block 502B. The second memory identifier may correspond to a second memory. The second memory may be a memory of the plurality of memories communicatively coupled to the memory repair unit. In some examples, the decoder may receive the first memory identifier before receiving the second memory identifier. Otherwise described, the decoder may receive the second memory identifier after receiving the first memory identifier.

In some examples, the memory repair unit may include a buffer. The buffer may be a shift register. As described above, the one or more memory identifiers may be stored in a memory (e.g., a repair information memory) communicatively coupled to the memory repair unit. In the example including a buffer, the buffer may be configured to receive the one or more identifiers from the memory. For example, the buffer may be configured to receive the one or more memory identifiers at block 501. The buffer may be configured to receive a first memory identifier at block 501A. The buffer may be configured to receive a first memory identifier at block 501B. The buffer may be configured to store the one or more received memory identifiers in the buffer. At block 503, the buffer may be configured to output one or more received memory identifiers to the decoder. For example, the buffer may be configured to output one or more received memory identifiers stored in the buffer to the decoder. In such examples, the decoder may be configured to receive the one or more memory identifiers from the buffer. For example, at block 503A, the buffer may be configured to output the first memory identifier to the decoder. At block 503B, the buffer may be configured to output the second memory identifier to the decoder. In some examples, the buffer may be configured to serially output each received memory identifier to the decoder. For example, the buffer may be configured to output the second memory identifier to the decoder after outputting the first memory identifier to the decoder.

At block 504, the decoder may be configured to determine (e.g., identify) which memory corresponds to a received memory identifier. For example, the decoder may be configured to determine which memory among the plurality of memories communicatively coupled to the memory repair unit corresponds to a received memory identifier. In the example shown, the decoder may be configured to determine that the first memory identifier corresponds to the first memory at block 504A. The decoder may be configured to determine that the second memory identifier corresponds to the second memory at block 504B. In some examples, to determine which memory corresponds to a received memory identifier, the decoder may be configured to input the received memory identifier into a data structure that maps a plurality of memory identifiers to the plurality of memories communicatively coupled to the memory repair unit. For example, to determine that the first memory identifier corresponds to the first memory, the decoder may be configured to input the first memory identifier into a data structure that maps a plurality of memory identifiers to the plurality of memories at block 504A-1. The data structure may refer to a repair enable memory map. For example, to determine that the second memory identifier corresponds to the second memory, the decoder may be configured to input the second memory identifier into the data structure that maps the plurality of memory identifiers to the plurality of memories at block 504B-1.

At block 506, the decoder may be configured to output a first value on a first conductive path corresponding to the first memory based on the determination that the first memory identifier corresponds to the first memory. At block 508, the accumulator may be configured to receive the first value on the first conductive path corresponding to the first memory. At block 510, the accumulator may be configured to store the first value corresponding to the first memory. In some examples, the accumulator includes a first accumulator circuit for storing the first value. In such examples, the first accumulator circuit may include a flip-flop circuit (e.g., a D flip-flop circuit) or a latch circuit. In such examples, the first conductive path corresponding to the first memory may communicatively couple a first output of the decoder to an input of the first accumulator circuit. At block 512, the accumulator may be configured to output the stored first value on a second conductive path connected to a repair enable input of the first memory. The first memory may be configured to perform memory repair based on the reception of the first value at the repair enable input. For example, outputting the first value to the repair enable input of the first memory may enable memory repair on the first memory. For example, the second conductive path may communicatively couple the output of the accumulator corresponding to the first memory to the repair enable input of the first memory.

At block 514, the decoder may be configured to output a second value on a first conductive path corresponding to the second memory based on the determination that the second memory identifier corresponds to the second memory. In some examples, the decoder may not be configured to output the first value and the second value in parallel. Otherwise described, the decoder may be configured to serially output the first value and the second value. At block 516, the accumulator may be configured to receive the second value on the first conductive path corresponding to the second memory. At block 518, the accumulator may be configured to store the second value corresponding to the second memory. In some examples, the accumulator includes a second accumulator circuit for storing the second value. In such examples, the second accumulator circuit may include a flip-flop circuit (e.g., a D flip-flop circuit) or a latch circuit. In such examples, the first conductive path corresponding to the second memory may communicatively couple a second output of the decoder to an input of the second accumulator circuit. At block 520, the accumulator may be configured to output the stored second value on a second conductive path connected to a repair enable input of the second memory. The second memory may be configured to perform memory repair based on the reception of the second value at the repair enable input. For example, outputting the second value to the repair enable input of the second memory may enable memory repair on the second memory. For example, the second conductive path may communicatively couple the output of the accumulator corresponding to the second memory to the repair enable input of the second memory. In some examples, the accumulator may be configured to output the first value and the second value in parallel. In some examples, the first value and the second value may be a non-zero voltage.

Figure 6:
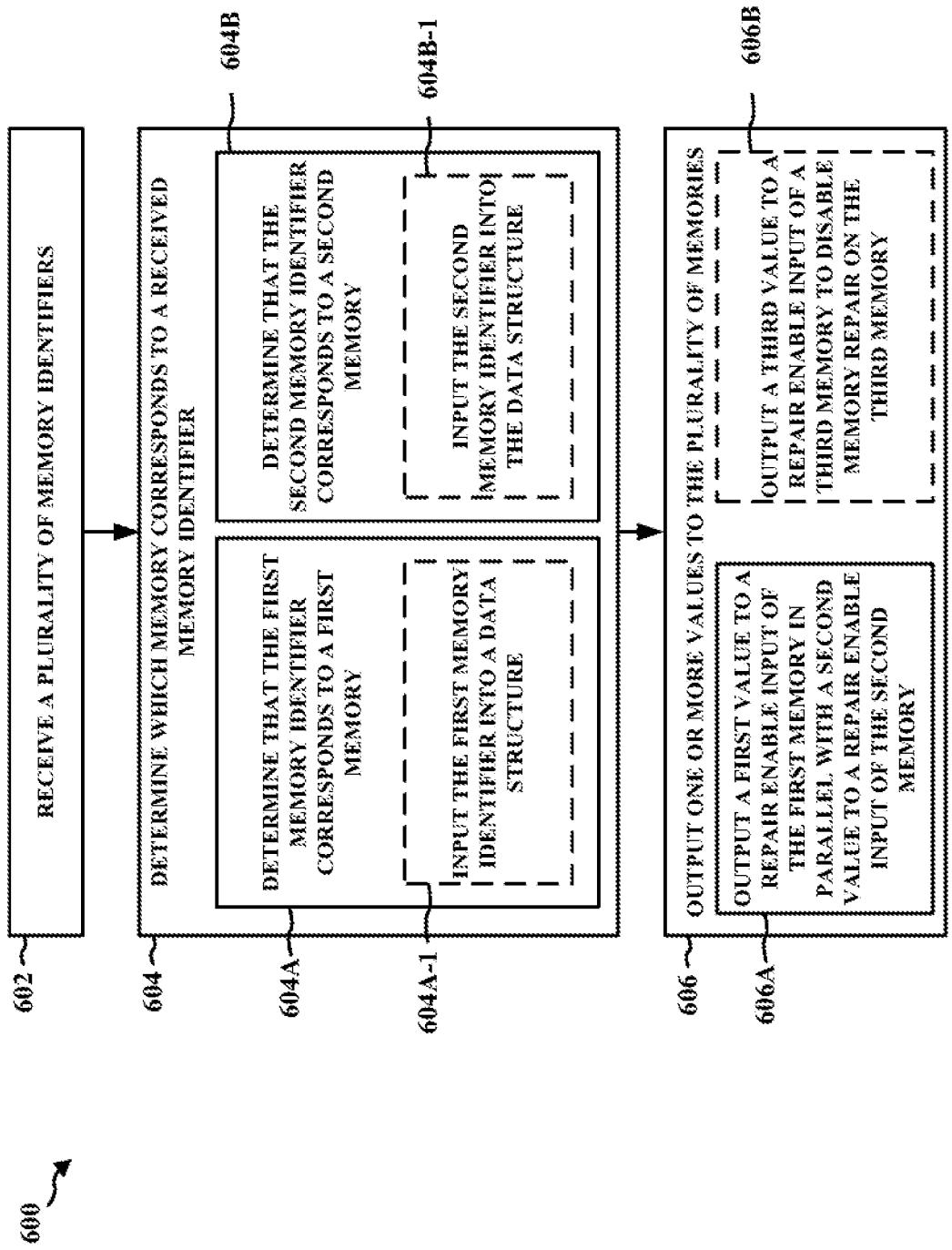
FIG. 6 illustrates an example flowchart of a method of memory repair in accordance with one or more techniques of this disclosure.

FIG. 6 illustrates an example flowchart 600 of a method of memory repair in accordance with one or more techniques of this disclosure. The method may be performed by a memory repair unit (or one or more components of the memory repair unit) of a processing unit (e.g., processing unit 100) or an SOC (e.g., SOC 200), such as memory repair unit 102, memory repair unit 202, or memory repair unit 402. In some examples, the method illustrated in flowchart 600 may include one or more functions described herein (e.g., one or more functions described with respect to FIGS. 1, 2, 3, 4A, and/or 4B) that are not illustrated in FIG. 6, and/or may exclude one or more illustrated functions.

At block 602, the memory repair unit may be configured to receive a plurality of memory identifiers. The plurality of memory identifiers may include a first memory identifier and a second memory identifier. Each memory identifier of the plurality of memory identifiers may correspond to a respective memory of a plurality of memories. For example, the first memory identifier may correspond to a first memory of the plurality of memories and the second memory identifier may correspond to a second memory of the plurality of memories.

At block 604, the memory repair unit may be configured to determine (e.g., identify) which memory corresponds to a received memory identifier. For example, the memory repair unit may be configured to determine which memory among the plurality of memories communicatively coupled to the memory repair unit corresponds to a received memory identifier. In the example shown, the memory repair unit may be configured to determine that the first memory identifier corresponds to the first memory at block 604A. The memory repair unit may be configured to determine that the second memory identifier corresponds to the second memory at block 604B. In some examples, the memory repair unit may be configured to determine that the second memory identifier corresponds to the second memory after determining that the first memory identifier corresponds to the first memory.

In some examples, to determine which memory corresponds to a received memory identifier, the memory repair unit may be configured to input the received memory identifier into a data structure that maps a plurality of memory identifiers to the plurality of memories communicatively coupled to the memory repair unit. For example, to determine that the first memory identifier corresponds to the first memory, the memory repair unit may be configured to input the first memory identifier into a data structure that maps a plurality of memory identifiers to the plurality of memories at block 604A-1. The data structure may refer to a repair enable memory map. For example, to determine that the second memory identifier corresponds to the second memory, the memory repair unit may be configured to input the second memory identifier into the data structure that maps the plurality of memory identifiers to the plurality of memories at block 604B-1.

At block 606, the memory repair unit may be configured to output one or more values to the plurality of memories. For example, at block 606A, the memory repair unit may be configured to output a first value to a repair enable input of the first memory in parallel with a second value to a repair enable input of the second memory. The first memory may be configured to perform memory repair based on the reception of the first value at the repair enable input. For example, outputting the first value to the repair enable input of the first memory may enable memory repair on the first memory. Similarly, the second memory may be configured to perform memory repair based on the reception of the second value at the repair enable input. For example, outputting the second value to the repair enable input of the second memory may enable memory repair on the second memory.

In some examples, the memory repair unit may be configured to not output a value to disable memory repair on a memory. In such examples, the repair enable input corresponding to a memory may be at a default value (e.g., zero voltage) resulting in disablement of the memory repair on the memory unless the memory repair unit outputs a value (e.g., a non-zero voltage) different from the default value to enable memory repair on the memory. In other examples, the memory repair unit may be configured to output a value to disable memory repair on a memory. For example, at block 606B, the memory repair unit may be configured to output, in parallel with the first value and the second value, a third value to a repair enable input of a third memory to disable memory repair on the third memory. In some examples, the memory repair unit may be configured to not receive the third memory identifier corresponding to the third memory. In such examples, the memory repair unit may be configured to output the third value to the repair enable input of the third memory to disable memory repair on the third memory based on not receiving the third memory identifier.

In some examples, a decoder of the memory repair unit may be configured to perform the functions corresponding to blocks 602, 604, 604A, 604B, 604A-1, and 604B-1; and an accumulator of the memory repair unit may be configured to perform the functions corresponding to blocks 606, 606A, and 606B.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

Further aspects of the disclosure are directed an apparatus incorporating the circuit blocks (e.g., the memory repair unit) and methods presented above. For example, the apparatus may be an end product, such as one of a cellular phone, a personal digital assistant (PDA), laptop computer, a desktop computer (PC), a computer peripheral device, a multimedia device, a video device, an audio device, a global positioning system (GPS), a wireless sensor, an Internet of Things device, or any other suitable device incorporating the circuits and features described with respect to FIGS. 1-6.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of memory repair, comprising:
   receiving, by a decoder, a first memory identifier, wherein the first memory identifier corresponds to a first memory, the first memory including one or more reserve memory cells;
   determining, by the decoder, that the first memory identifier corresponds to the first memory;
   outputting, by the decoder, a first value on a first conductive path corresponding to the first memory based on determining that the first memory identifier corresponds to the first memory, the first value indicating that the first memory includes at least one defective memory cell;
   receiving, by an accumulator separate from the one or more reserve memory cells, the first value on the first conductive path corresponding to the first memory;
   storing, by the accumulator, the first value corresponding to the first memory, wherein the accumulator includes a first accumulator circuit for storing the first value; and
   outputting, by the accumulator, the first value on a second conductive path connected to a first repair enable input of the first memory.

2. The method of claim 1, wherein outputting the first value on the second conductive path connected to the first repair enable input of the first memory includes outputting the first value on the second conductive path connected to the first repair enable input of the first memory to enable memory repair on the first memory.

3. The method of claim 1, wherein a processing unit or a system-on-chip (SOC) includes a memory repair unit, wherein the memory repair unit comprises: the decoder and the accumulator.

4. The method of claim 1, wherein the first accumulator circuit includes a flip-flop circuit or a latch circuit.

5. The method of claim 1, wherein determining that the first memory identifier corresponds to the first memory comprises:
   inputting the first memory identifier into a data structure that maps a plurality of memory identifiers to a plurality of memories.

6. The method of claim 1, further comprising:
   receiving, by a buffer, the first memory identifier; and outputting, by the buffer, the first memory identifier to the decoder.

7. The method of claim 6, wherein receiving, by the decoder, the first memory identifier includes receiving, by the decoder from the buffer, the first memory identifier.

8. The method of claim 6, wherein the buffer is a shift register.

9. The method of claim 1, wherein the first value is a non-zero voltage.

10. The method of claim 1, further comprising:
receiving, by the decoder, a second memory identifier after receiving the first memory identifier, wherein the second memory identifier corresponds to a second memory;
determining, by the decoder, that the second memory identifier corresponds to the second memory;
outputting, by the decoder, a second value on a first conductive path corresponding to the second memory based on determining that the second memory identifier corresponds to the second memory;
receiving, by the accumulator, the second value on the first conductive path corresponding to the second memory;
storing, by the accumulator, the second value corresponding to the second memory; and
outputting, by the accumulator, the second value on a second conductive path connected to a first repair enable input of the second memory.

11. The method of claim 10, further comprising:
receiving, by a buffer, the second memory identifier; and
outputting, by the buffer, the second memory identifier to the decoder after outputting the first memory identifier to the decoder.

12. The method of claim 10, wherein outputting the first value and the second value by the decoder does not occur in parallel, and outputting the first value and the second value by the accumulator occurs in parallel.

13. The method of claim 10, wherein the accumulator further includes a second accumulator circuit for storing the second value, wherein the first accumulator circuit includes a first flip-flop circuit or a first latch circuit, and wherein the second accumulator circuit includes a second flip-flop circuit or a second latch circuit.

14. An apparatus for memory repair, comprising:
a plurality of memories that includes a first memory, the first memory including one or more reserve memory cells;
a repair information memory storing a first memory identifier that corresponds to the first memory; and
a memory repair unit communicatively coupled to the repair information memory and the plurality of memories, wherein the memory repair unit comprises a decoder and an accumulator separate from the one or more reserve memory cells,
wherein the decoder is configured to: receive the first memory identifier stored in the repair information memory; determine that the first memory identifier corresponds to the first memory; and output a first value on a first conductive path corresponding to the first memory based on the determination that the first memory identifier corresponds to the first memory, the first value indicating that the first memory includes at least one defective memory cell, and
wherein the accumulator is configured to: receive the first value on the first conductive path corresponding to the first memory; store the first value corresponding to the first memory, wherein the accumulator includes a first accumulator circuit configured to store the first value; and output the first value on a second conductive path connected to a first repair enable input of the first memory.

15. The apparatus of claim 14, wherein the first accumulator circuit includes a flip-flop circuit or a latch circuit.

16. The apparatus of claim 14, wherein to determine that the first memory identifier corresponds to the first memory, the decoder is configured to input the first memory identifier into a data structure that maps a plurality of memory identifiers to a plurality of memories.

17. The apparatus of claim 14,
wherein the decoder is further configured to: receive a second memory identifier after the first memory identifier is received, the second memory identifier corresponding to a second memory; determine that the second memory identifier corresponds to the second memory; and output a second value on a first conductive path corresponding to the second memory based on the determination that the second memory identifier corresponds to the second memory, and
wherein the accumulator is further configured to: receive the second value on the first conductive path corresponding to the second memory; store the second value corresponding to the second memory; and output the second value on a second conductive path connected to a first repair enable input of the second memory.

18. The apparatus of claim 17, wherein the decoder is configured to not output the first value and the second value in parallel, and wherein the accumulator is configured to output the first value and the second value in parallel.

19. The apparatus of claim 17, wherein the accumulator further includes a second accumulator circuit configured to store the second value, wherein the first accumulator circuit includes a first flip-flop circuit or a first latch circuit, and wherein the second accumulator circuit includes a second flip-flop circuit or a second latch circuit.

20. An apparatus, comprising:
a repair information memory;
a plurality of memories; and
a memory repair unit communicatively coupled to the repair information memory and the plurality of memories, wherein the memory repair unit is configured to:
receive, from the repair information memory, a plurality of memory identifiers, wherein the plurality of memory identifiers includes a first memory identifier and a second memory identifier, wherein each memory identifier of the plurality of memory identifiers corresponds to a respective memory of the plurality of memories, wherein the first memory identifier corresponds to a first memory of the plurality of memories and the second memory identifier corresponds to a second memory of the plurality of memories;
determine that the first memory identifier corresponds to the first memory;
determine that the second memory identifier corresponds to the second memory; and
output:
a first value to a repair enable input of the first memory; and
a second value to a repair enable input of the second memory;
wherein an accumulator of the memory repair unit is configured to store the first value in a first accumulator circuit and the second value in a second accumulator circuit and to perform the outputting of the first value to the repair enable input of the first memory and the outputting of the second value to the repair enable input of the second memory, the accumulator being separate from one or more reserve cells of the plurality of memories, the first value indicating that the first memory includes at least one defective memory cell, and the second value indicating that the second memory includes another at least one defective memory cell.

21. The apparatus of claim 20, wherein to output the first value to the repair enable input of the first memory, the memory repair unit is configured to output the first value to the repair enable input of the first memory to enable memory repair on the first memory, and wherein to output the second value to the repair enable input of the second memory, the memory repair unit is configured to output the second value to the repair enable input of the second memory to enable memory repair on the second memory.

22. The apparatus of claim 20, wherein the memory repair unit is configured to:
output a third value to a repair enable input of a third memory to disable memory repair on the third memory, wherein the plurality of memories includes the third memory.

23. The apparatus of claim 22, wherein the memory repair unit is configured to:
not receive a third memory identifier corresponding to the third memory, wherein to output the third value to the repair enable input of the third memory to disable memory repair on the third memory, the memory repair unit is configured to output the third value to the repair enable input of the third memory based on not receiving the third memory identifier to disable memory repair on the third memory.

24. The apparatus of claim 20, wherein to determine that the second memory identifier corresponds to the second memory, the memory repair unit is configured to determine that the second memory identifier corresponds to the second memory after determining that the first memory identifier corresponds to the first memory.

25. The apparatus of claim 20, wherein a decoder of the memory repair unit is configured to perform the determination that the first memory identifier corresponds to the first memory and the determination that the second memory identifier corresponds to the second memory.

26. The apparatus of claim 25, further comprising:
one of a cellular phone, a personal digital assistant (PDA), laptop computer, a desktop computer (PC), a computer peripheral device, a multimedia device, a video device, an audio device, a global positioning system (GPS), a wireless sensor, and an Internet of Things device incorporating the memory repair unit, the first memory, and the second memory.

27. The apparatus of claim 20, wherein the first memory and the second memory are associated with different functional blocks.

* * * * *